United States Patent
Bae et al.

(10) Patent No.: US 10,288,941 B2
(45) Date of Patent: May 14, 2019

(54) WINDOW DISPLAY DEVICE

(71) Applicant: Samsung Display Co., Ltd, Yongin-si, Gyeonggi-do (KR)

(72) Inventors: Jongsung Bae, Hwaseong-si (KR); Mugyeom Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/347,576

(22) Filed: Nov. 9, 2016

(65) Prior Publication Data
US 2017/0168338 A1    Jun. 15, 2017

(30) Foreign Application Priority Data
Dec. 15, 2015 (KR) .......................... 10-2015-0179302

(51) Int. Cl.
| | | |
|---|---|---|
| *B60K 35/00* | (2006.01) | |
| *H01L 27/32* | (2006.01) | |
| *H01L 51/52* | (2006.01) | |
| *G02F 1/1335* | (2006.01) | |
| *G02F 1/1368* | (2006.01) | |
| *G02F 1/13363* | (2006.01) | |

(52) U.S. Cl.
CPC .......... *G02F 1/13363* (2013.01); *B60K 35/00* (2013.01); *G02F 1/1368* (2013.01); *G02F 1/133514* (2013.01); *G02F 1/133528* (2013.01); *H01L 27/3248* (2013.01); *H01L 27/3262* (2013.01); *H01L 51/5253* (2013.01); *H01L 51/5281* (2013.01); *B60K 2350/2034* (2013.01); *G02F 1/133502* (2013.01); *G02F 2001/133638* (2013.01); *G02F 2201/50* (2013.01); *G02F 2413/04* (2013.01); *H01L 27/3244* (2013.01)

(58) Field of Classification Search
None
See application file for complete search history.

(56) References Cited

U.S. PATENT DOCUMENTS

| | | | | |
|---|---|---|---|---|
| 7,230,767 | B2 * | 6/2007 | Walck | B32B 17/10036 345/7 |
| 2004/0027513 | A1 * | 2/2004 | Yuuki | G02F 1/133536 349/96 |
| 2006/0125986 | A1 * | 6/2006 | Choo | G02F 1/133555 349/114 |
| 2009/0153781 | A1 * | 6/2009 | Otani | G02B 5/3016 349/74 |
| 2011/0128240 | A1 * | 6/2011 | Choi | G02F 1/13 345/173 |
| 2015/0016085 | A1 * | 1/2015 | Natsumeda | G02B 5/008 362/19 |
| 2015/0234254 | A1 * | 8/2015 | Schowengerdt | G02F 1/292 359/316 |

* cited by examiner

*Primary Examiner* — Ryan Crockett
(74) *Attorney, Agent, or Firm* — Innovation Counsel LLP

(57) ABSTRACT

A window display device according to the present inventive concept, the window display device includes a display panel configured to display an image, a first glass disposed on a first surface of the display panel, a first laminating member including a first polarizing layer disposed on a first surface of the first glass and a second polarizing layer disposed on a second surface of the first glass. The first polarizing layer includes a first supporting film and a first polarizing film disposed on the first supporting film. The second polarizing layer includes a second supporting film and a second polarizing film disposed on the second supporting film.

6 Claims, 21 Drawing Sheets

WINDOW DISPLAY DEVICE

CROSS-REFERENCE TO RELATED APPLICATIONS

This application claims priority under 35 U.S.C. § 119 to Korean Patent Application No. 10-2015-0179302, filed on Dec. 15, 2015 in the Korean Intellectual Property Office KIPO, the contents of which are herein incorporated by reference in their entireties.

BACKGROUND

1. Field

Exemplary embodiments of the present inventive concept relates to a window display device.

2. Description of the Related Art

As demands on various type of display devices have recently increased with the development of an information society, studies on display devices, such as a liquid crystal display device (LCD), a plasma display panel (PDP), a field emission display device (FED), and electrophoretic display device (EPD) and an organic light emitting display device (OLED), have been actively conducted.

A display apparatus includes a display panel and a display panel driver. The display panel includes a plurality of gate lines, a plurality of data lines and a plurality of sub-pixels. The sub-pixels are connected to the gate lines and data lines. The display panel driver includes a timing controller, a gate driver and a data driver. The gate driver outputs a gate signal to the gate line. The data driver outputs a data voltage to the data line. The sub-pixels of the display panel represent luminance based on the data voltage.

The display apparatus may be used in vehicles in place of a regular window. For example, the display apparatus may be used to superimpose data on top of the natural view, in augmented reality applications. However, when the display apparatus is attached to the window of vehicles, problems such as increased thickness and decrease of optical properties may occur.

SUMMARY

Exemplary embodiments of the present inventive concept provide a window display device capable of preventing scattering of window of vehicles.

In an exemplary embodiment of a window display device according to the present inventive concept, the window display device includes a display panel configured to display an image, a first glass disposed on a first surface of the display panel, a first laminating member including a first polarizing layer disposed on a first surface of the first glass and a second polarizing layer disposed on a second surface of the first glass. The first polarizing layer includes a first supporting film and a first polarizing film disposed on the first supporting film. The second polarizing layer includes a second supporting film and a second polarizing film disposed on the second supporting film.

In an exemplary embodiment, the display panel may include a first substrate on which a thin film transistor is disposed, a second substrate facing the first substrate and on which a color filter is disposed and a liquid crystal layer interposed between the first substrate and the second substrate.

In an exemplary embodiment, the second substrate, the liquid crystal layer and the first substrate may be sequentially disposed on the first laminating member.

In an exemplary embodiment, the first polarizing film and the second polarizing film may be quarter-wavelength ($1/4\lambda$) films.

In an exemplary embodiment, the window display device may further include a half-wavelength ($1/2\lambda$) film disposed on the second surface of the display panel.

In an exemplary embodiment, the window display device may further include a second glass disposed on the second surface of the display panel and a second laminating member including a third polarizing layer disposed on a first surface of the second glass and a fourth polarizing layer disposed on a second surface of the second glass. The third polarizing layer includes a third supporting film and a third polarizing film disposed on the third supporting film. The fourth polarizing layer includes a fourth supporting film and a fourth polarizing film disposed on the fourth supporting film.

In an exemplary embodiment, the third polarizing film and the fourth polarizing film may be quarter-wavelength ($1/4\lambda$) films.

In an exemplary embodiment, the first substrate, the liquid crystal layer and the second substrate may be sequentially disposed on the first laminating member. The window display device may further include a light source configured to provide light to the display panel.

In an exemplary embodiment, the first polarizing film and the second polarizing film may be quarter-wavelength ($1/4\lambda$) films.

In an exemplary embodiment, the window display device may further include a second glass disposed on the second surface of the display panel, a second laminating member including a third polarizing layer disposed on a first surface of the second glass and a fourth polarizing layer disposed on a second surface of the second glass. The third polarizing layer may include a third supporting film and a third polarizing film disposed on the third supporting film. The fourth polarizing layer may include a fourth supporting film and a fourth polarizing film disposed on the fourth supporting film.

In an exemplary embodiment, the third polarizing film and the fourth polarizing film may be quarter-wavelength ($1/4\lambda$) films.

In an exemplary embodiment, the window display device may further include a thin film transistor substrate on which a thin film transistor is disposed, a first electrode electrically connected to the thin film transistor, an organic light emitting element disposed on the first electrode, a second electrode covering the organic light emitting element and an encapsulation substrate facing the thin film transistor substrate and disposed on the second electrode.

In an exemplary embodiment, the encapsulation substrate and the thin film transistor substrate may be sequentially disposed on the first laminating member.

In an exemplary embodiment, the first polarizing film and the second polarizing film may be $1/8$-wavelength ($1/8\lambda$) films.

In an exemplary embodiment, the window display device may further include a second glass disposed on the second surface of the display panel and a second laminating member including a third polarizing layer disposed on a first surface of the second glass and a fourth polarizing layer disposed on a second surface of the second glass. The third polarizing layer may include a third supporting film and a third polarizing film disposed on the third supporting film. The fourth polarizing layer may include a fourth supporting film and a fourth polarizing film disposed on the fourth supporting film.

In an exemplary embodiment, the third polarizing film and the fourth polarizing film may be ⅛-wavelength (⅛λ) films.

In an exemplary embodiment, the thin film transistor substrate and the encapsulation substrate may be sequentially disposed on the first laminating member.

In an exemplary embodiment, the first polarizing film and the second polarizing film may be ⅛-wavelength (⅛λ) films.

In an exemplary embodiment, the window display device may further include a second glass disposed on the second surface of the display panel and a second laminating member comprising a third polarizing layer disposed on a first surface of the second glass and a fourth polarizing layer disposed on a second surface of the second glass. The third polarizing layer may include a third supporting film and a third polarizing film disposed on the third supporting film. The fourth polarizing layer may include a fourth supporting film and a fourth polarizing film disposed on the fourth supporting film.

In an exemplary embodiment, the third polarizing film and the fourth polarizing film may be ⅛-wavelength (⅛λ) films.

According to the present exemplary embodiment, a window display device includes a plurality of polarizing layers including supporting films and polarizing films. Thus, scattering of window of vehicles may be prevented.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, the present inventive concept will be explained in detail with reference to the accompanying drawings.

Figure 1:
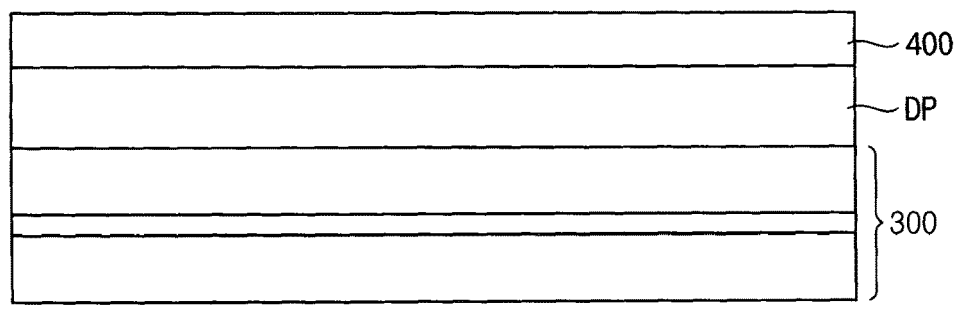
FIG. 1 is a cross-sectional view illustrating a window display device according to an exemplary embodiment of the inventive concept.
Figure 2:
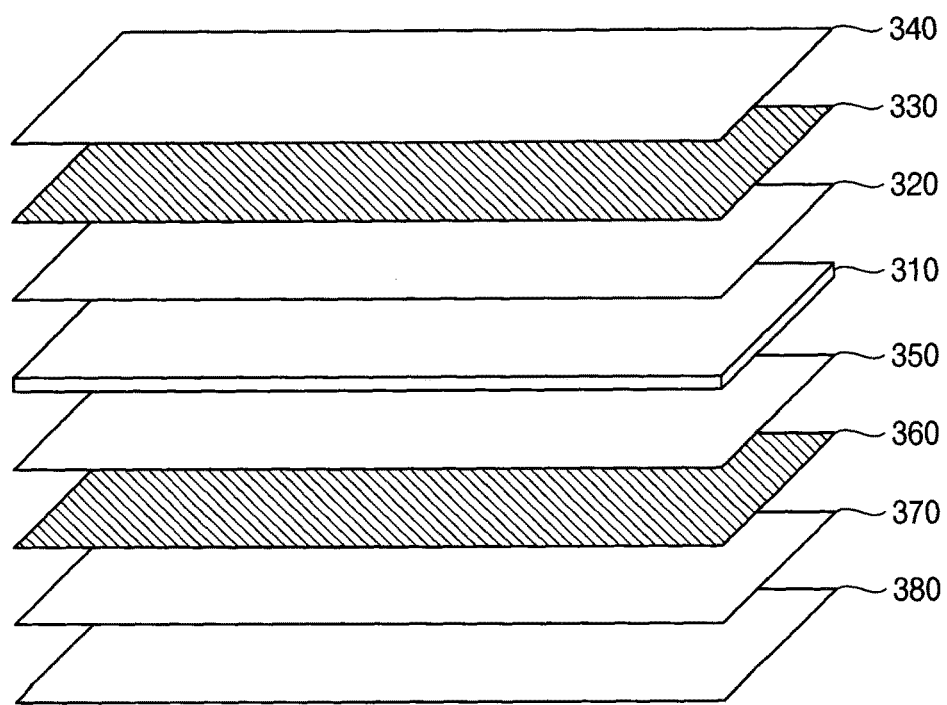
FIG. 2 is a perspective view illustrating a first laminating member of FIG. 1.

FIG. 1 is a cross-sectional view illustrating a window display device according to an exemplary embodiment of the inventive concept. FIG. 2 is a perspective view illustrating a first laminating member of FIG. 1.

Referring to FIGS. 1 and 2, a window display device according to an exemplary embodiment of the inventive concept includes a display panel DP, a first laminating member 300, a first glass 310 and a second laminating member 400.

The first laminating member 300 may include a first polarizing layer disposed on a first surface of the first glass 310, a second polarizing layer disposed on a second surface of the first glass 310 and a protection film 380. The first polarizing layer may include first supporting films 320 and 340 and the first polarizing film 330 disposed on the first supporting films 320 and 340. The second polarizing layer may include second supporting films 350 and 370 and second polarizing film 360 disposed on the second supporting films 350 and 370. The second laminating member 400 may include a half-wavelength (½λ) film. The first glass 310 may be a glass for vehicle.

The first supporting films 320 and 340 are disposed on the first glass 310. The first supporting films 320 and 340 may support the first polarizing film 330. The first supporting films 320 and 340 may improve the durability, robustness, thermal resistance and moisture tolerance of the first polarizing film 330.

The first supporting films 320 and 340 may include tri acetate cellulose ("TAC").

Alternatively, the first supporting films 320 and 340 may include polyethyleneterephthalate, polyethylene glycol, polymethylmetacrylate, polycarbonate and so on.

The first polarizing film 330 polarizes the light passing through the first polarizing film 330. For example, the first polarizing film 330 includes polyvinyl alcohol ("PVA"). The first polarizing film 330 may be manufactured by adsorbing iodine or a dichromatic dye on a PVA film and extending the PVA film in a direction.

Alternatively, the first polarizing film 330 may include polycarbonate, polystyrene, polymethacrylate and so on.

In the present exemplary embodiment, the first polarizing film 330 may be a quarter-wavelength (¼λ) film.

The second supporting films 350 and 370 are disposed on the first glass 310. The second supporting films 350 and 370 may support the second polarizing film 360. The second supporting films 350 and 370 may improve durability, robustness, thermal resistance and moisture tolerance of the second polarizing film 360.

The second supporting films 350 and 370 may include tri acetate cellulose ("TAC").

Alternatively, the second supporting films 350 and 370 may include polyethyleneterephthalate, polyethylene glycol, polymethylmetacrylate, polycarbonate and so on.

The second polarizing film 360 polarizes the light passing through the second polarizing film 360. For example, the second polarizing film 360 includes polyvinyl alcohol ("PVA"). The second polarizing film 360 may be manufactured by adsorbing iodine or a dichromatic dye on a PVA film and extending the PVA film in a direction.

Alternatively, the second polarizing film 360 may include polycarbonate, polystyrene, polymethacrylate and so on.

In the present exemplary embodiment, the second polarizing film 360 may be a quarter-wavelength (¼λ) film.

In the present exemplary embodiment, the first laminating member 300 includes the first polarizing film 330 and the second polarizing film 360 formed as a quarter-wavelength (¼λ) film. That is, the first laminating member 300 includes two quarter-wavelength (¼λ) films. However, the present inventive concept is not limited thereto, and the first laminating member 300 may include four ⅛-wavelength (⅛λ) films.

The protection film 380 is on the second supporting film 370. The protection film 380 may include a hard coating layer, an antireflection layer, an antisticking layer, an antiglare layer, etc.

An ultraviolet curable resin such as silicone may be solidified to form the hard coating layer to protect a surface of the polarizing film from an impact and a scratch.

The antisticking layer prevents the attaching of the polarizing film to another element.

The antiglare layer prevents the reflection of the externally provided light to improve a contrast ratio of a display device. The antiglare layer may be formed through a sand blast process, an embossing process, etc. Alternatively, transparent micro particles may be included in the protection film 380 to form the antiglare layer. A diameter of each of the micro particles may be about 0.5 μm to about 20 μm. Examples of the transparent micro particles that can be used for the protection film 380 include silica, alumina, titanic, zirconia, tin oxide, indium oxide, cadmium oxide, ammonium oxide, etc. The transparent micro particles may be conductive inorganic particles, organic particles, etc. The organic particles may include a crosslinked polymer, a non-cross linked polymer, etc. A ratio of a transparent matrix of the transparent micro particles is about 100:2 to about 100:70. For example, the ratio of the transparent matrix to the transparent micro particles may be about 100:5 to about 100:50. The antiglare layer may also function as a diffusion layer that diffuses an internally provided light to increase a viewing angle of the display device.

A phase of the first laminating member 300 and a phase of the second laminating member 400 may be substantially the same.

Figure 3:
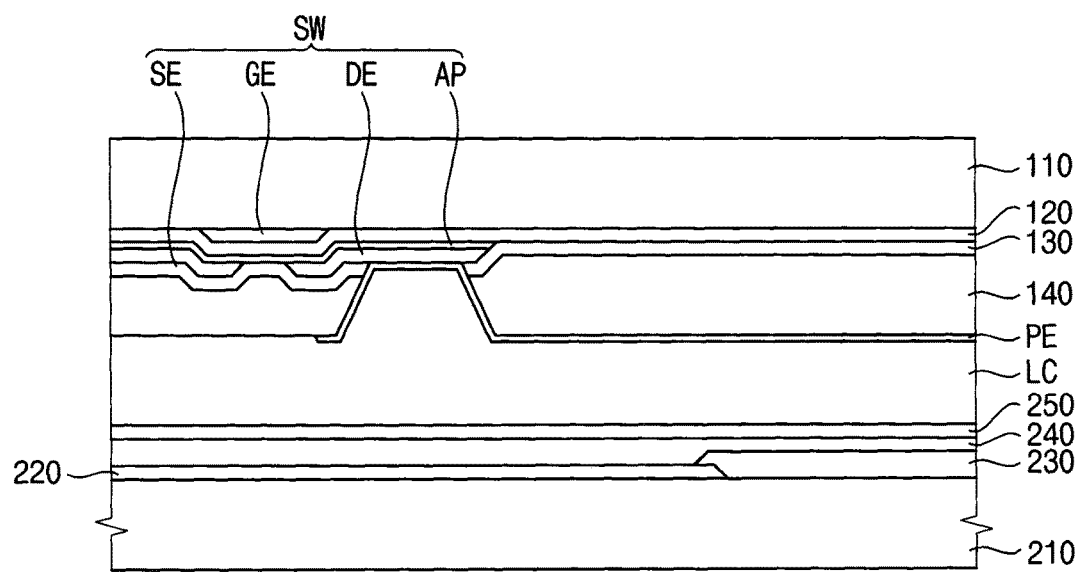
FIG. 3 is a cross-sectional view illustrating a display panel of FIG. 1.

FIG. 3 is a cross-sectional view illustrating a display panel of FIG. 1.

Referring to FIG. 3, The display panel DP includes a lower substrate 110, a gate electrode GE, a source electrode SE, a drain electrode DE, active pattern AP, a pixel electrode PE, a first insulation layer 120, a second insulation layer 130, an organic layer 140, a liquid crystal layer LC, an upper substrate 210, a black matrix 220, a color filter 230, an over coating layer 240 and a common electrode 250.

Examples of the lower substrate 110 may include a glass substrate, a quartz substrate, a silicon substrate, a plastic substrate and the like.

The gate electrode GE is disposed on the lower substrate 110. The gate electrode GE electrically connected with the gate line GL. The gate electrode GE may have a single layer structure including copper (Cu), silver (Ag), chrome (Cr), molybdenum (Mo), aluminum (Al), titanium (Ti), manganese (Mn) and a mixture thereof. In addition, the gate electrode GE may have a multi layer structure having a plurality of layers including materials different from each other. For example, the gate electrode GE may include a copper layer and a titanium layer disposed on and/or under the copper layer.

The first insulation layer 120 is formed on the gate electrode GE. The first insulation layer 120 may cover the lower substrate 110 and a first conductive pattern including the gate electrode GE. The first insulation layer 120 may include an inorganic material such as silicon oxide (SiOx) and/or silicon nitride (SiNx). For example, the first insulation layer 120 includes silicon oxide (SiOx), and may have a thickness of about 500 Å. In addition, the first insulation layer 120 may include a plurality of layers including different materials from each other.

An active pattern AP is formed on the first insulation layer 120. The active pattern AP is formed on the first insulation layer 120 in an area in which the gate electrode GE is formed. The active pattern AP may be overlapped with the gate electrode GE. The active pattern AP may be partially overlapped with the source electrode SE and the drain electrode DE. The active pattern AP may be disposed between the gate electrode GE and the source electrode SE. The active pattern may be disposed between the gate electrode GE and the drain electrode DE.

The source electrode SE and the drain electrode DE may be formed on the active pattern AP. The source electrode SE and the drain electrode DE may be spaced apart from each other. The source electrode SE and the drain electrode DE may be formed from the same layer as the data line DL.

The source electrode SE and the drain electrode DE may have a single layer structure including copper (Cu), silver (Ag), chrome (Cr), molybdenum (Mo), aluminum (Al), titanium (Ti), manganese (Mn) and a mixture thereof. In addition, the source electrode SE and the drain electrode DE may have a multi layer structure having a plurality of layers including materials different from each other. For example, the source electrode SE and the drain electrode DE may include a copper layer and a titanium layer disposed on and/or under the copper layer.

The second insulation layer 130 may be formed on the source electrode SE and the drain electrode DE. The second insulation layer 130 may be formed with a material including silicon oxide (SiOx) or silicon nitride (SiNx).

The organic layer 140 is disposed on the second insulation layer 130. The organic layer 140 planarizes an upper surface of the substrate so that problems due to the step such as disconnection of a signal line may be prevented. The organic layer 140 may be an insulation layer including an organic material. The organic layer 140 may be a color filter.

The pixel electrode PE is formed on the organic layer 140. The pixel electrode PE may be electrically connected with the drain electrode DE through a first contact hole. The pixel electrode PE may include a transparent conductive material, such as indium tin oxide (ITO) and indium zinc oxide (IZO). In addition, the pixel electrode PE may include titanium (Ti) and/or molybdenum titanium (MoTi).

Examples of the upper substrate 210 may include a glass substrate, a quartz substrate, a silicon substrate, a plastic substrate and the like.

The black matrix 220 is disposed on the upper substrate 210 on which a gate line, a data line, a gate electrode GE, a source electrode SE and a drain electrode DE are disposed. The black matrix 220 blocks light and is disposed corresponding to a non-display area on which an image is not displayed.

The color filter 230 is disposed on upper substrate 210 on which the black matrix 220 is disposed. The color filter 230 supplies colors to the light passing through the liquid crystal layer LC. The color filter 230 may include a red color filter, a green color filter and blue color filter. The color filter 230 corresponds to a unit pixel. The color filters adjacent to each other may have different colors. The color filter 230 may be overlapped with adjacent color filter 230 in a boundary of the adjacent unit pixels. In addition, the color filter 230 may be spaced apart from adjacent color filter 230 in the boundary of the adjacent unit pixels.

The over-coating layer 240 is disposed on the color filter 230 and the black matrix 220. The over-coating layer 240 flattens the color filter 230, protects the color filter 230, and insulates the color filter 230. The over-coating layer 240 may include acrylic-epoxy material.

The common electrode 250 is disposed on the over-coating layer 240.

The liquid crystal layer LC is disposed between the lower substrate 110 and the upper substrate 210. The liquid crystal layer LC includes liquid crystal molecules having optical anisotropy. The liquid crystal molecules are driven by electric field, so that an image is displayed by passing or blocking light through the liquid crystal layer LC.

In the present exemplary embodiment, the first laminating member 300 is disposed inside of a vehicle, and the second laminating member 400 is disposed outside of a vehicle. A "vehicle," as used herein, is any device or apparatus that may be moved from one place to another while allowing the user to see the surroundings through a window. Hence, a "vehicle," as used in this disclosure, is not limited to just a means of transportation such as automobiles and airplanes but also gear that a user may wear and see through while moving. In addition, the lower substrate 110 of the display panel DP is disposed adjacent to the second laminating member 400, and the upper substrate 210 of the display panel DP is disposed adjacent to the first laminating member 300. Thus, the upper substrate 210, the liquid crystal layer LC and the lower substrate 110 are sequentially disposed on the first laminating member 300. The display panel DP may be a transparent display panel. The display panel DP may receive light from an outside light source such as the sun or a streetlight to display an image.

Figure 4:
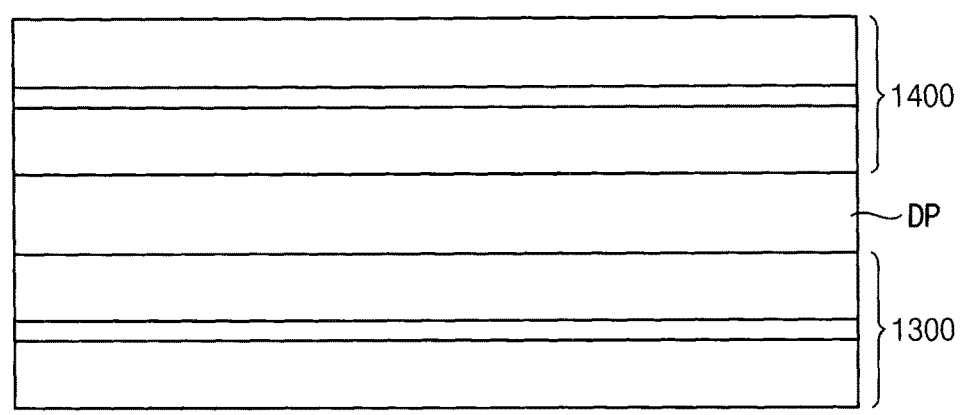
FIG. 4 is a cross-sectional view illustrating a window display device according to an exemplary embodiment of the inventive concept.
Figure 5:
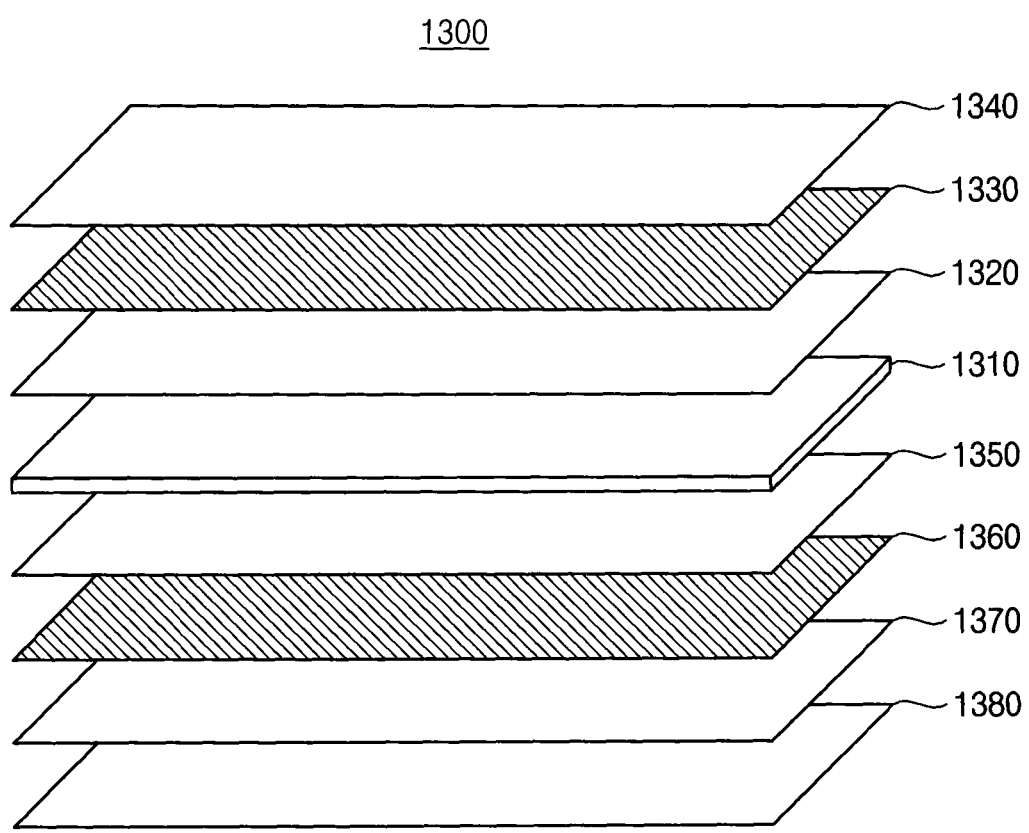
FIG. 5 is a perspective view illustrating a first laminating member of FIG. 4.
Figure 6:
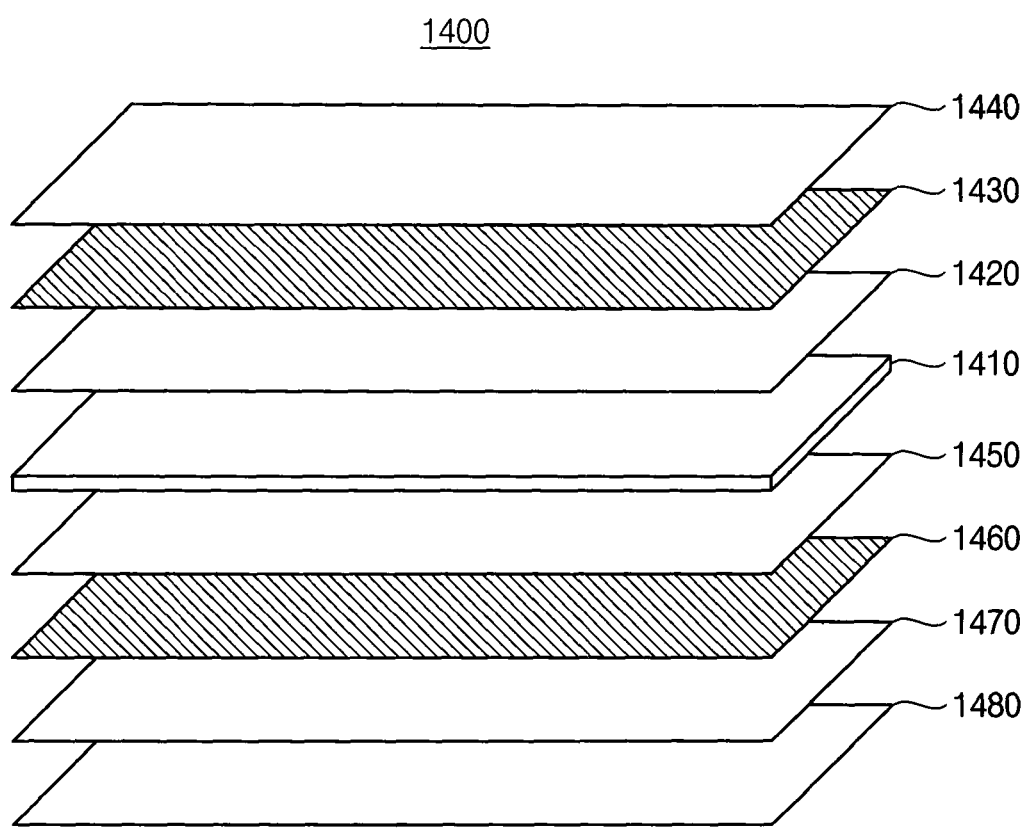
FIG. 6 is a perspective view illustrating a second laminating member of FIG. 4.

FIG. 4 is a cross-sectional view illustrating a window display device according to an exemplary embodiment of the inventive concept. FIG. 5 is a perspective view illustrating a first laminating member of FIG. 4. FIG. 6 is a perspective view illustrating a second laminating member of FIG. 4.

Referring to FIGS. 4 to 6, a window display device according to an exemplary embodiment of the inventive concept includes a display panel DP, a first laminating member 1300, a first glass 1310, a second glass 1410 and a second laminating member 1400.

The first laminating member 1300 may include a first polarizing layer disposed on a first surface of the first glass 1310, a second polarizing layer disposed on a second surface of the first glass 1310 and a protection film 1380. The first polarizing layer may include first supporting films 1320 and 1340 and the first polarizing film 1330 disposed on the first supporting films 1320 and 1340. The second polarizing layer may include second supporting films 1350 and 1370 and second polarizing film 1360 disposed on the second supporting films 1350 and 1370. The second laminating member 1400 may include a half-wavelength ($\frac{1}{2}\lambda$) film. The first glass 1310 may be a glass/window of a vehicle.

The first supporting films 1320 and 1340 are disposed on the first glass 1310. The first supporting films 1320 and 1340 may support the first polarizing film 1330. The first supporting films 1320 and 1340 may improve the durability, robustness, thermal resistance, and moisture tolerance of the first polarizing film 1330.

The first supporting films 1320 and 1340 may include tri acetate cellulose ("TAC").

Alternatively, the first supporting films 1320 and 1340 may include polyethyleneterephthalate, polyethylene glycol, polymethylmetacrylate, polycarbonate and so on.

The first polarizing film 1330 polarizes the light passing through the first polarizing film 1330. For example, the first polarizing film 1330 includes polyvinyl alcohol ("PVA"). The first polarizing film 1330 may be manufactured by adsorbing iodine or a dichromatic dye on a PVA film and extending the PVA film in a direction.

Alternatively, the first polarizing film 1330 may include polycarbonate, polystyrene, polymethacrylate and so on.

In the present exemplary embodiment, the first polarizing film 1330 may be a quarter-wavelength ($\frac{1}{4}\lambda$) film.

The second supporting films 1350 and 1370 are disposed on the first glass 1310. The second supporting films 1350 and 1370 may support the second polarizing film 1360. The second supporting films 1350 and 1370 may improve the durability, robustness, thermal resistance, and moisture tolerance of the second polarizing film 1360.

The second supporting films 1350 and 1370 may include tri acetate cellulose ("TAC").

Alternatively, the second supporting films 1350 and 1370 may include polyethyleneterephthalate, polyethylene glycol, polymethylmetacrylate, polycarbonate and so on.

The second polarizing film 1360 polarizes the light passing through the second polarizing film 1360. For example, the second polarizing film 1360 includes polyvinyl alcohol ("PVA"). The second polarizing film 1360 may be manufactured by adsorbing iodine or a dichromatic dye on a PVA film and extending the PVA film in a direction.

Alternatively, the second polarizing film 1360 may include polycarbonate, polystyrene, polymethacrylate and so on.

In the present exemplary embodiment, the second polarizing film 1360 may be a quarter-wavelength (¼λ) film.

A phase of the first laminating member 1300 and a phase of the second laminating member 1400 may be substantially the same. The second laminating member 1400 is substantially same as the first laminating member 1300, and thus repetitive explanation will be omitted. Briefly, the second laminating member 1400 includes a first polarizing layer disposed on a first surface of the first glass 1410, a second polarizing layer disposed on a second surface of the first glass 1410 and a protection film 1480. The first polarizing layer may include first supporting films 1420 and 1440 and the first polarizing film 1430 disposed on the first supporting films 1420 and 1440. The second polarizing layer may include second supporting films 1450 and 1470 and second polarizing film 1460 disposed on the second supporting films 1450 and 1470.

Figure 7:
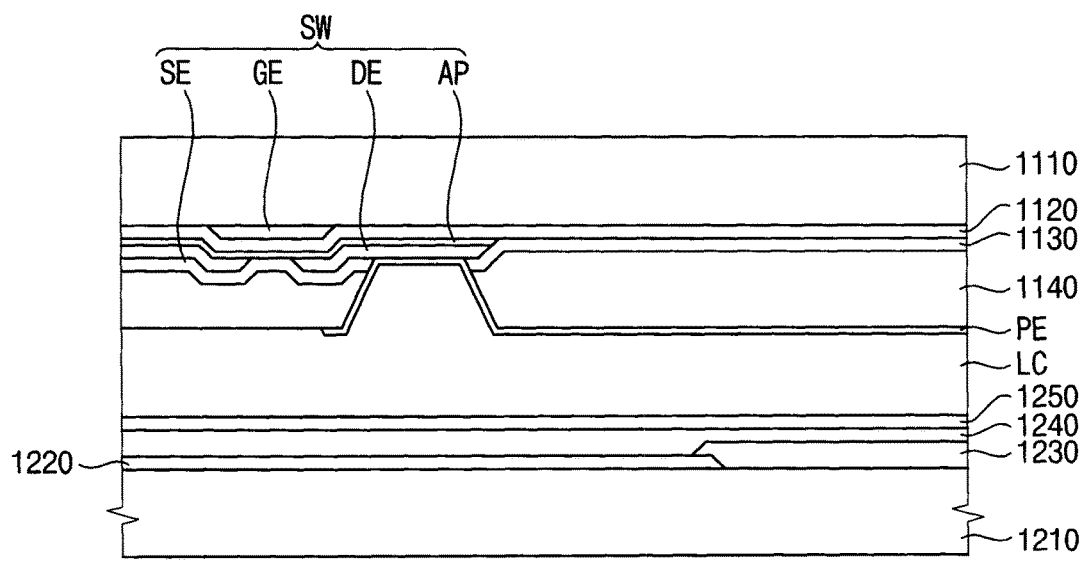
FIG. 7 is a cross-sectional view illustrating a display panel of FIG. 4.

FIG. 7 is a cross-sectional view illustrating a display panel of FIG. 4.

The display panel DP according to the present exemplary embodiment is substantially same as the display panel DP of FIGS. 1 and 3, and thus same reference numerals are used for same elements and repetitive explanation will be omitted.

In the present exemplary embodiment, the first laminating member 1300 is disposed inside of a vehicle, and the second laminating member 1400 is disposed outside of a vehicle. In addition, the lower substrate 1110 of the display panel DP is disposed adjacent to the second laminating member 1400, and the upper substrate 1210 of the display panel DP is disposed adjacent to the first laminating member 1300. Thus, the upper substrate 1210, the liquid crystal layer LC and the lower substrate 1110 are sequentially disposed on the first laminating member 1300. The display panel DP may be a transparent display panel. The display panel DP may be provided light from an outside light source such as the sun or a streetlight to display an image.

Figure 8:
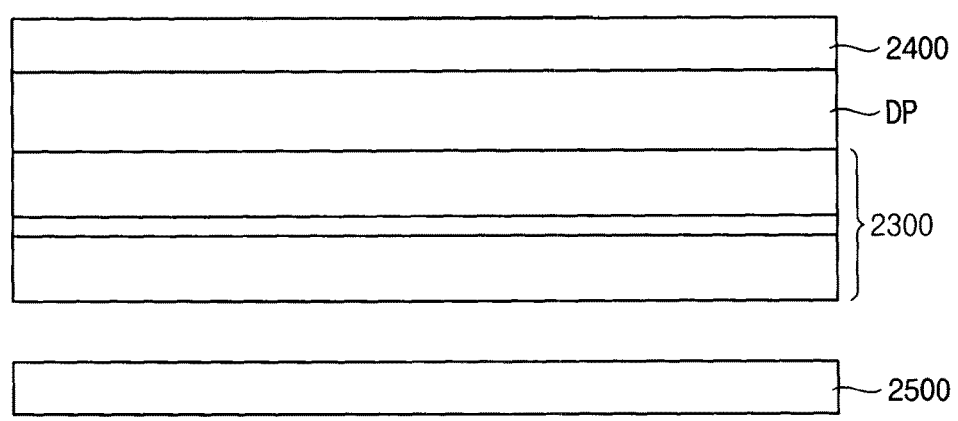
FIG. 8 is a cross-sectional view illustrating a window display device according to an exemplary embodiment of the inventive concept.
Figure 9:
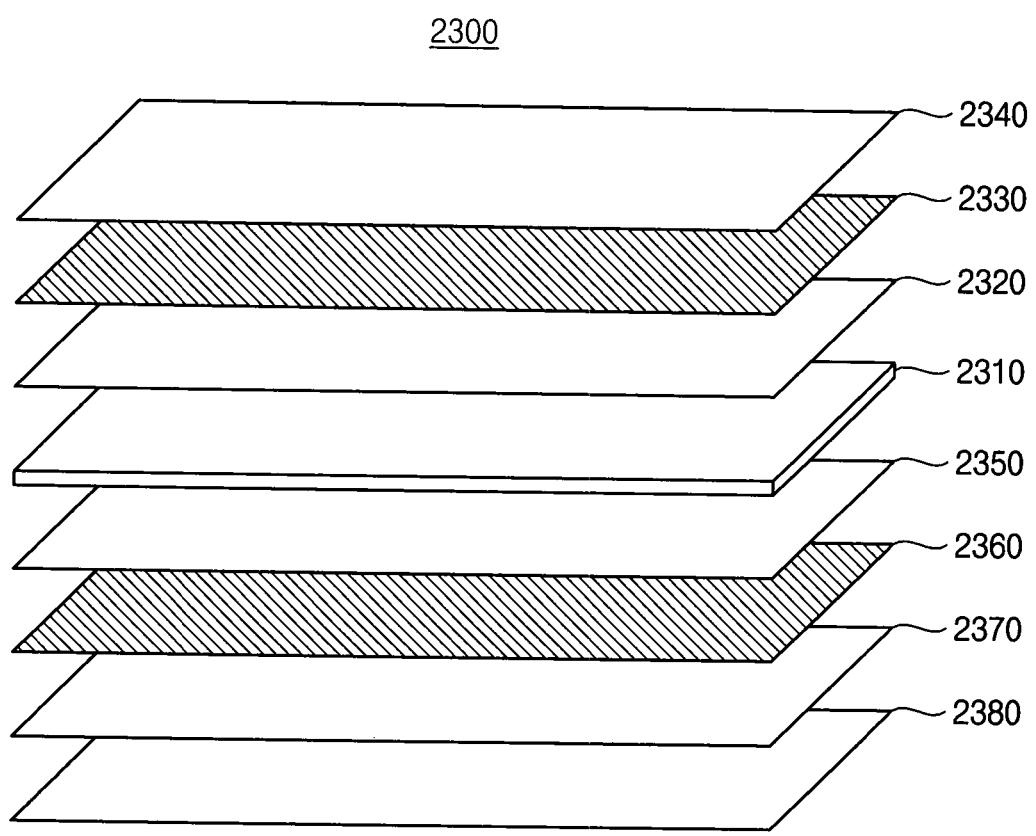
FIG. 9 is a perspective view illustrating a first laminating member of FIG. 8.
Figure 10:
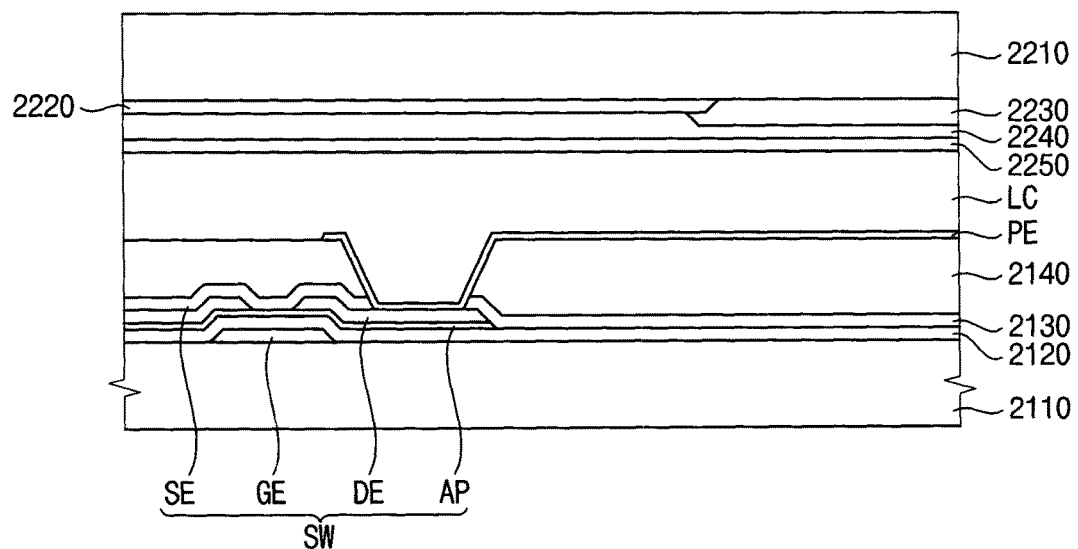
FIG. 10 is a cross-sectional view illustrating a display panel of FIG. 8.

FIG. 8 is a cross-sectional view illustrating a window display device according to an exemplary embodiment of the inventive concept. FIG. 9 is a perspective view illustrating a first laminating member of FIG. 8. FIG. 10 is a cross-sectional view illustrating a display panel of FIG. 8.

The window display device according to the present exemplary embodiment is substantially same as the window display device of FIGS. 1 to 3 except for a direction of the display panel DP and a light source 2500, and thus same reference numerals are used for same elements and repetitive explanation will be omitted.

Referring to FIGS. 8 to 10, a window display device according to an exemplary embodiment of the inventive concept includes a display panel DP, a first laminating member 2300, a first glass 2310, a second laminating member 2400 and a light source 2500.

In the present exemplary embodiment, the first laminating member 2300 is disposed inside of a vehicle, and the second laminating member 2400 is disposed outside of a vehicle. In addition, the lower substrate 2110 of the display panel DP is disposed adjacent to the first laminating member 2300, and the upper substrate 2210 of the display panel DP is disposed adjacent to the second laminating member 2400. Thus, the lower substrate 2110, the liquid crystal layer LC and the upper substrate 2210 are sequentially disposed on the first laminating member 2300. The display panel DP may be a transparent display panel. The display panel DP may be provided light from the light source 2500 to display an image.

Figure 11:
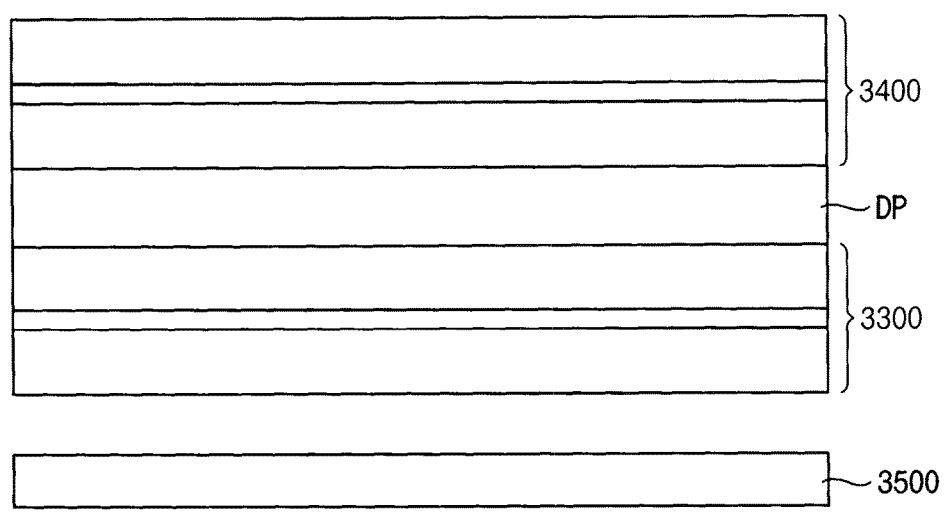
FIG. 11 is a cross-sectional view illustrating a window display device according to an exemplary embodiment of the inventive concept.
Figure 12:
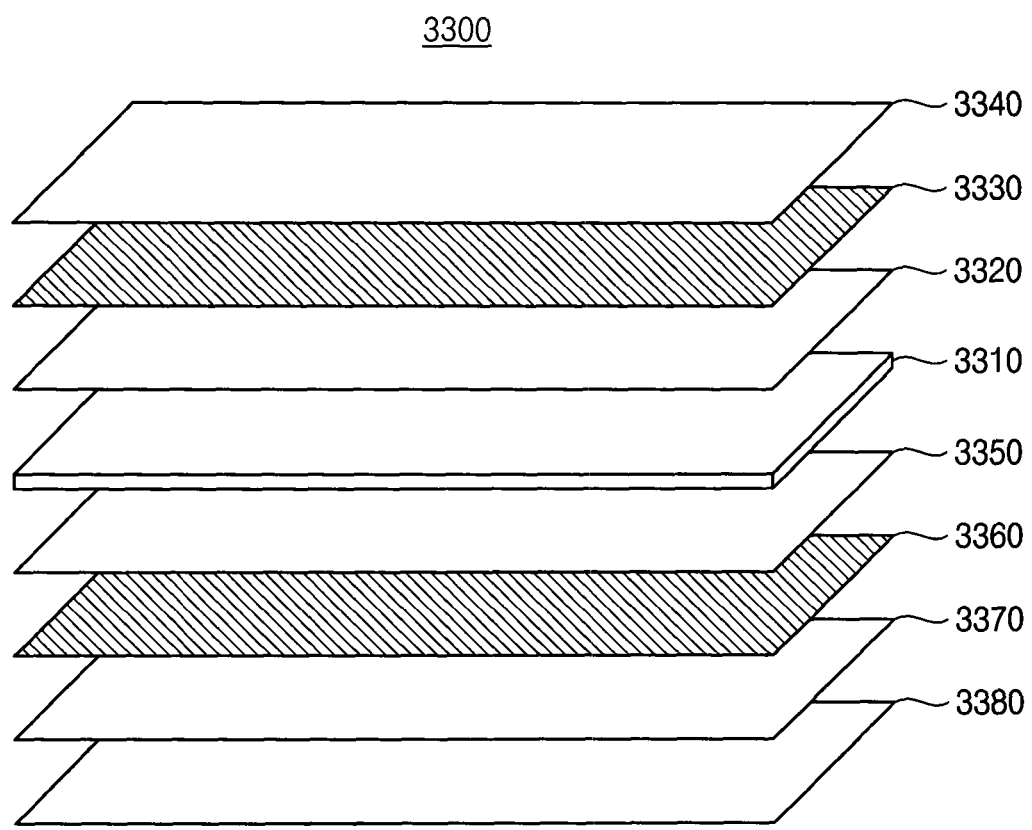
FIG. 12 is a perspective view illustrating a first laminating member of FIG. 11.
Figure 13:
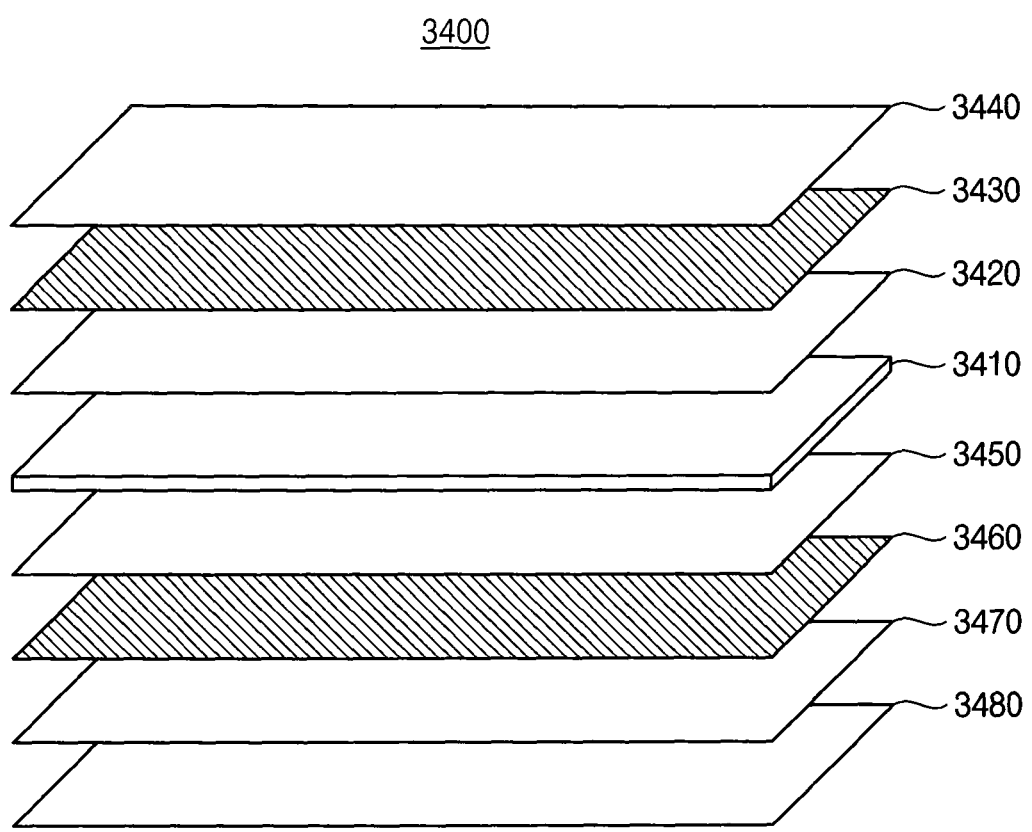
FIG. 13 is a perspective view illustrating a second laminating member of FIG. 11.
Figure 14:
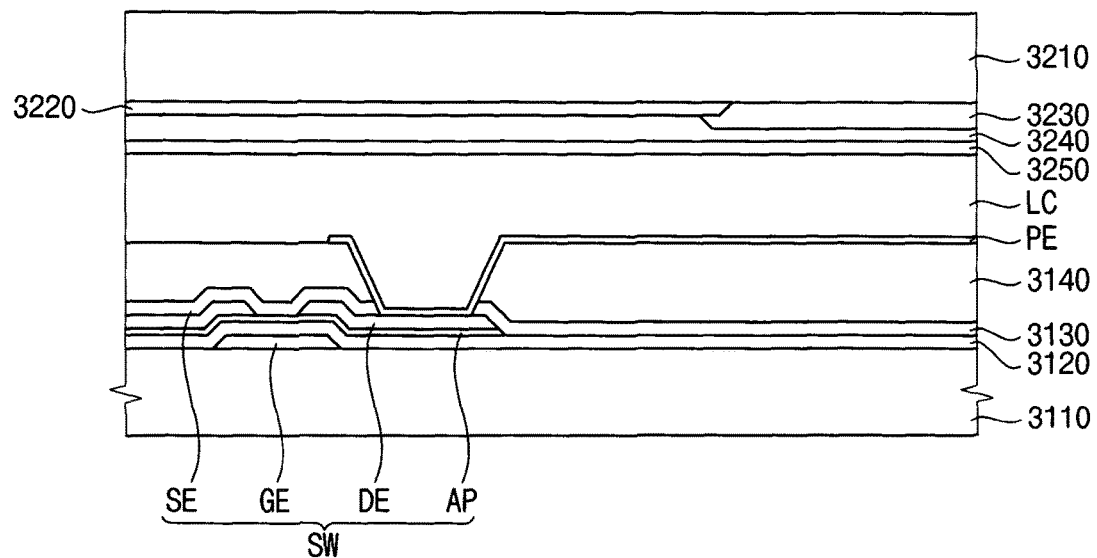
FIG. 14 is a cross-sectional view illustrating a display panel of FIG. 11.

FIG. 11 is a cross-sectional view illustrating a window display device according to an exemplary embodiment of the inventive concept. FIG. 12 is a perspective view illustrating a first laminating member of FIG. 11. FIG. 13 is a perspective view illustrating a second laminating member of FIG. 11. FIG. 14 is a cross-sectional view illustrating a display panel of FIG. 11.

The window display device according to the present exemplary embodiment is substantially same as the window display device of FIGS. 4 to 7 except for a direction of the display panel DP and a light source 3500, and thus same reference numerals are used for same elements and repetitive explanation will be omitted.

Referring to FIGS. 11 to 14, a window display device according to an exemplary embodiment of the inventive concept includes a display panel DP, a first laminating member 3300, a first glass 3310, a second glass 3410, a second laminating member 3400 and a light source 3500.

In the present exemplary embodiment, the first laminating member 3300 is disposed inside of a vehicle, and the second laminating member 3400 is disposed outside of a vehicle. In addition, the lower substrate 3110 of the display panel DP is disposed adjacent to the first laminating member 3300, and the upper substrate 3210 of the display panel DP is disposed adjacent to the second laminating member 4300. Thus, the lower substrate 3110, the liquid crystal layer LC and the upper substrate 3210 are sequentially disposed on the first laminating member 3300. The display panel DP may be a transparent display panel. The display panel DP may receive light from the light source 2500 to display an image.

Figure 15:
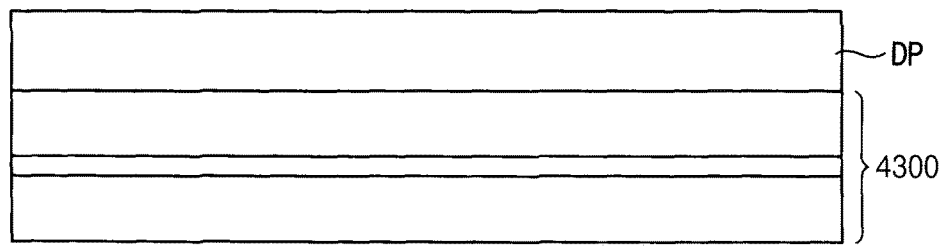
FIG. 15 is a cross-sectional view illustrating a window display device according to an exemplary embodiment of the inventive concept.
Figure 16:
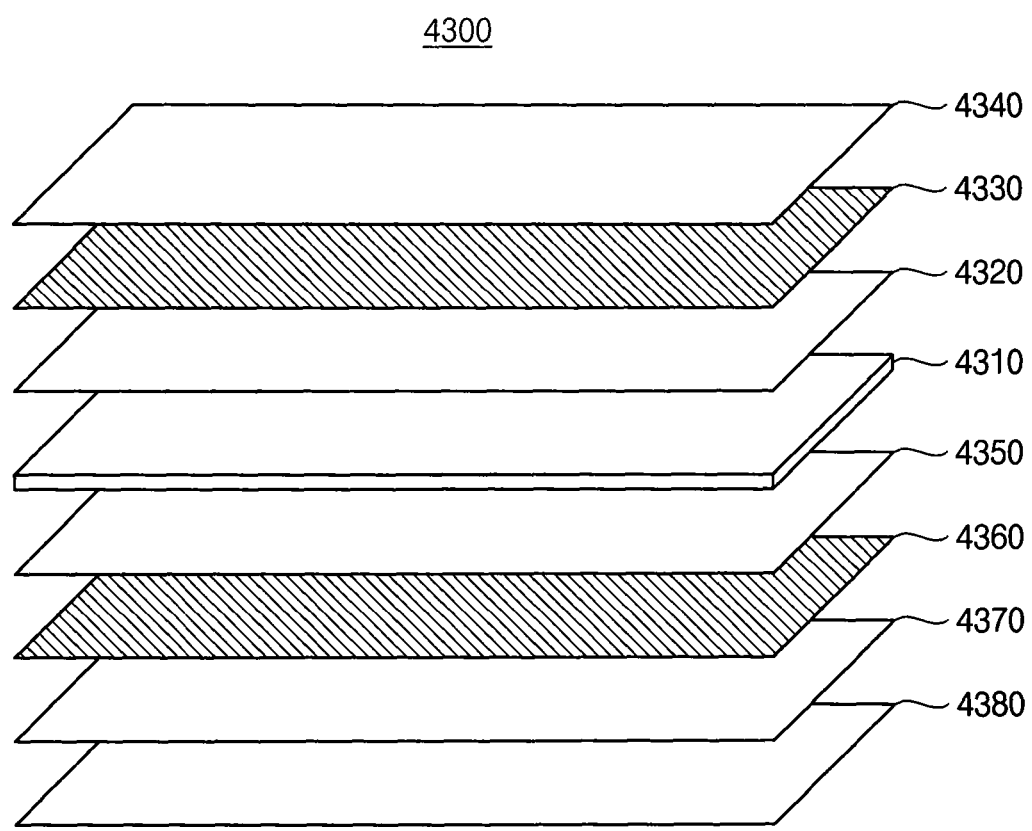
FIG. 16 is a perspective view illustrating a first laminating member of FIG. 15.

FIG. 15 is a cross-sectional view illustrating a window display device according to an exemplary embodiment of the inventive concept. FIG. 16 is a perspective view illustrating a first laminating member of FIG. 15.

Referring to FIGS. 15 and 16, a window display device according to an exemplary embodiment of the inventive concept includes a display panel DP, a first laminating member 4300 and a first glass 4310.

The first laminating member 4300 may include a first polarizing layer disposed on a first surface of the first glass 4310, a second polarizing layer disposed on a second surface of the first glass 4310 and a protection film 4380. The first polarizing layer may include first supporting films 4320 and 4340 and the first polarizing film 4330 disposed on the first supporting films 4320 and 4340. The second polarizing layer may include second supporting films 4350 and 4370 and second polarizing film 4360 disposed on the second supporting films 4350 and 4370. The first glass 4310 may be a glass of a vehicle.

The first supporting films 4320 and 4340 are disposed on the first glass 4310. The first supporting films 4320 and 4340 may support the first polarizing film 4330. The first supporting films 4320 and 4340 may improve the durability, robustness, thermal resistance, and moisture tolerance of the first polarizing film 4330.

The first supporting films 4320 and 4340 may include tri acetate cellulose ("TAC").

Alternatively, the first supporting films 4320 and 4340 may include polyethyleneterephthalate, polyethylene glycol, polymethylmetacrylate, polycarbonate and so on.

The first polarizing film 4330 polarizes the light passing through the first polarizing film 4330. For example, the first polarizing film 4330 includes polyvinyl alcohol ("PVA"). The first polarizing film 4330 may be manufactured by adsorbing iodine or a dichromatic dye on a PVA film and extending the PVA film in a direction.

Alternatively, the first polarizing film 4330 may include polycarbonate, polystyrene, polymethacrylate and so on.

In the present exemplary embodiment, the first polarizing film 4330 may be a ⅛-wavelength (⅛λ) film.

The second supporting films 4350 and 4370 are disposed on the first glass 4310. The second supporting films 4350 and 4370 may support the second polarizing film 4360. By the second supporting films 4350 and 4370, a durability, a solidity, a thermal resistance and a moisture tolerance of the second polarizing film 4360 may be improved.

The second supporting films 4350 and 4370 may include tri acetate cellulose ("TAC").

Alternatively, the second supporting films 4350 and 4370 may include polyethyleneterephthalate, polyethylene glycol, polymethylmetacrylate, polycarbonate and so on.

The second polarizing film 4360 polarizes the light passing through the second polarizing film 4360. For example, the second polarizing film 4360 includes polyvinyl alcohol ("PVA"). The second polarizing film 4360 may be manufactured by adsorbing iodine or a dichromatic dye on a PVA film and extending the PVA film in a direction.

Alternatively, the second polarizing film 4360 may include polycarbonate, polystyrene, polymethacrylate and so on.

In the present exemplary embodiment, the second polarizing film 4360 may be a ⅛-wavelength (⅛λ) film.

In the present exemplary embodiment, the first laminating member 4300 includes the first polarizing film 4330 and the second polarizing film 4360 formed as a ⅛-wavelength (⅛λ) film. That is, the first laminating member 4300 includes two ⅛-wavelength (⅛λ) films. However, the present inventive concept is not limited thereto, the first laminating member 4300 may include four 1/16-wavelength (1/16λ) films.

The protection film 4380 is on the second supporting film 4370. The protection film 4380 may include a hard coating layer, an antireflection layer, an antisticking layer, an antiglare layer, etc.

An ultraviolet curable resin such as silicone may be solidified to form the hard coating layer to protect a surface of the polarizing film from an impact and a scratch.

The antisticking layer prevents the attaching of the polarizing film to another element.

The antiglare layer prevents the reflection of the externally provided light to improve a contrast ratio of a display device. The antiglare layer may be formed through a sand blast process, an embossing process, etc. Alternatively, transparent micro particles may be included in the protection film 4380 to form the antiglare layer. A diameter of each of the micro particles may be about 0.5 μm to about 20 μm. Examples of the transparent micro particles that can be used for the protection film 4380 include silica, alumina, titania, zirconia, tin oxide, indium oxide, cadmium oxide, ammonium oxide, etc. The transparent micro particles may be conductive inorganic particles, organic particles, etc. The organic particles may include a crosslinked polymer, a non-cross linked polymer, etc. A ratio of a transparent matrix of the transparent micro particles is about 100:2 to about 100:70. For example, the ratio of the transparent matrix to the transparent micro particles may be about 100:5 to about 100:50. The antiglare layer may also function as a diffusion layer that diffuses an internally provided light to increase a viewing angle of the display device.

Figure 17:
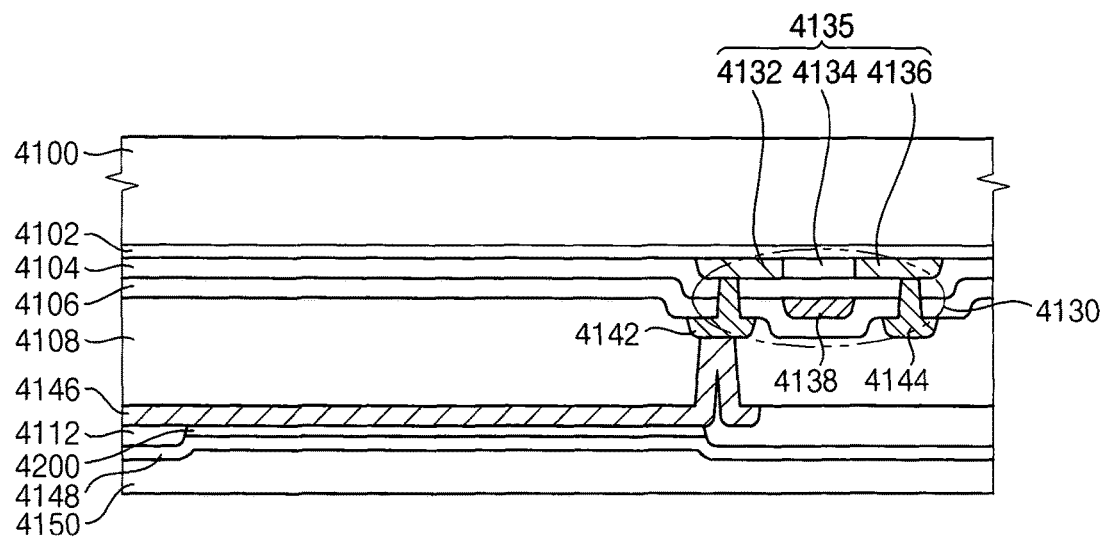
FIG. 17 is a cross-sectional view illustrating a display panel of FIG. 15.

FIG. 17 is a cross-sectional view illustrating a display panel of FIG. 15.

Referring to FIG. 17, a display panel DP includes a thin film transistor substrate 4100, a buffer layer 4102, a gate insulating layer 4104, an insulating interlayer 4106, a planarizing layer 4108, a pixel defining layer 4112, a thin film transistor (TFT) 4130, a first electrode 4146, a second electrode 4148, an organic light emitting element 4200 and an encapsulation substrate 4150.

The thin film transistor substrate 4100 may include a transparent insulating substrate. For example, the thin film transistor substrate 4100 may include a glass substrate, a quartz substrate, a transparent resin substrate including a transparent resin, etc. Examples of a transparent resin that may be used for the thin film transistor substrate 4100 may include a polyimide resin, an acrylic resin, a polyacrylate resin, a polycarbonate resin, a polyether resin, a polyethylene terephthalate resin, a sulfonic acid based resin, etc.

The buffer layer 4102 is disposed on the thin film transistor substrate 4100, and includes an insulating material. Examples of the insulating material that may be used for the buffer layer 4102 may include an inorganic insulating material such as silicon oxide (SiOx), silicon nitride (SiNx), silicon oxinitride (SiOxNy), silicon carbon-oxide (SiOxCy), silicon carton-nitride (SiCxNy), etc. The inorganic insulating material may be used alone, a combination thereof, a mixture thereof or a stacked structure thereof. When the buffer layer 4102 includes the stacked structure, the buffer layer 4102 may have a multi-layered structure including a silicon oxide layer, a silicon nitride layer, a silicon oxinitride layer, a silicon carton-oxide layer and/or a silicon carbon-nitride layer.

The buffer layer 4102 prevents diffusion of metal atoms or impurities from the thin film transistor substrate 4100 to control speed of heat transfer during subsequent crystallization process for an active pattern 4135. Thus, electric characteristics of the active pattern 4135 may be improved. Also, the buffer layer 4102 planarizes a surface of the thin film transistor substrate 4100.

The active pattern 4135 is disposed on the buffer layer 4102. For example, the active pattern 4135 may include polysilicon. The active pattern 4135 includes a drain contact portion 4132, a source contact portion 4136 and a channel portion 4134. The drain contact portion 4132 makes contact with a drain electrode 4142 of a thin film transistor 4130. The source contact portion 4136 makes contact with a source electrode 4144 of the thin film transistor 4130. The channel portion 4134 is interposed between the drain contact portion 4132 and the source contact portion 4136.

The gate insulating layer 4104 is disposed on the buffer layer 4102 on which the active pattern 4135 is formed to electrically insulate the active pattern 4135 from the gate electrode 4138 and a gate line (not shown). The gate insulating layer 4104 may include silicon nitride, metal oxide, etc. Examples of an insulating material that may be used for the gate insulating layer 4104 may include hafnium oxide (HfOx), aluminum oxide (AlOx), zirconium oxide (ZrOx), titanium oxide (TiOx), Tantalum oxide (TaOx), etc. These may be used alone, a combination thereof, a mixture thereof or a stacked structure thereof. The gate insulating layer 4104 may include a plurality of contact holes through which the source contact portion 4136 and the drain contact portion 4132 are exposed.

The gate electrode 4138 is disposed on the gate insulating layer 4104. The gate electrode 4138 is disposed on the channel portion 4134 of the active pattern 4135. When a voltage difference is formed between the gate electrode 4138 and the source electrode 4144, the thin film transistor 4130 is turned on so that a current flows through the channel portion 4134 toward the drain electrode 4142.

The gate electrode 4138 may include a conductive material such as metal, alloy, metal nitride, conductive metal oxide, transparent conductive material, etc. Examples of the conductive material that may be used for the gate electrode 4138 may include aluminum, aluminum alloy, aluminum nitride (AlNx), silver (Ag), silver alloy, tungsten (W), tungsten nitride (WNx), copper, copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These can be used alone or in a combination thereof. Also, the gate electrode 4138 may have a mono-layered structure or a multi-layered structure including a metal layer, an alloy layer, a metal nitride layer, a conductive metal oxide layer and/or a transparent conductive material layer.

The insulating interlayer 4106 is formed on the gate insulating layer 4104 on which the gate electrode 4138 and the gate line (not shown) are formed. The insulating interlayer 4106 insulates the gate electrode 4138 and the gate line (not shown) from the source electrode 4144 and the drain electrode 4142.

The insulating interlayer 4106 may include silicon compound. Examples of an insulating material that may be used for the insulating interlayer 4106 may include silicon oxide, silicon nitride, silicon oxinitride, silicon carbon-nitride, silicon carbon-oxide, etc. These may be used alone of in a combination thereof. The insulating interlayer 4106 has a plurality of contact holes through which the source portion 4136 and the drain portion 4132 of the active pattern 4135 are exposed.

The source electrode 4144 and the drain electrode 4142 are formed on the insulating interlayer 4106. The source electrode 4144 and the drain electrode 4142 make contact with the source portion 4136 and the drain portion 4132 of the active pattern 4135, respectively.

The source and drain electrodes 4144 and 4142 may include a conductive material such as metal, alloy, metal nitride, conductive metal oxide, transparent conductive material, etc. Examples of the conductive material that may be used for the source and drain electrodes 4144 and 4142 may include aluminum, aluminum alloy, aluminum nitride (AlNx), silver (Ag), silver alloy, tungsten (W), tungsten nitride (WNx), copper, copper alloy, nickel (Ni), chromium (Cr), chromium nitride (CrNx), molybdenum (Mo), molybdenum alloy, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), indium tin oxide (ITO), tin oxide (SnOx), indium oxide (InOx), gallium oxide (GaOx), indium zinc oxide (IZO), etc. These can be used alone or in a combination thereof. Also, the source and drain electrodes 4144 and 4142 may have a mono-layered structure or a multi-layered structure including a metal layer, an alloy layer, a metal nitride layer, a conductive metal oxide layer and/or a transparent conductive material layer.

The planarizing layer 4108 is formed on the insulating interlayer 4106 on which the source and drain electrodes 4144 and 4142 and the date line (not shown) to electrically insulate the source electrode 4144 from the first electrode 4146.

The planarizing layer 4108 may include organic insulating material or inorganic insulating material. Examples of the insulating material that may be used for the planarizing layer 4108 may include a photoresist, an acrylic resin, a polyimide resin, a polyamide resin, a siloxine resin, a photoresist acryl carboxyl resin, a novolak resin, an alkaline solable resin, silicon compound, silicon nitride, silicon oxinitride, silicon carbon-oxide, silicon carbon-nitride, etc. These may be used alone or in a combination thereof.

The planarizing layer 4108 has a contact hole through which the drain electrode 4142 is exposed.

The first electrode 4146 is disposed on the planarizing layer 4108 corresponding to the pixel region, and is electrically connected to the drain electrode 4142 through the contact hole of the planarizing layer 4108.

When the display panel DP has a front illumination type, the first electrode 4146 may include a reflective metal, a reflective alloy, etc. For example, the first electrode 4146 may include silver, platinum, gold, chromium, tungsten, molybdenum, titanium, palladium, iridium, an alloy thereof, etc. These may be alone or in a combination thereof. Alternatively, the first electrode 4146 may include a transparent conductive material such as indium tin oxide, tin oxide, indium zinc oxide, zinc oxide, indium gallium oxide, gallium oxide, etc. These may be used alone or in a combination thereof.

The pixel defining layer 4112 is disposed on the planarizing layer 4108 on which the first electrode 4146 is formed, to expose a portion of the first electrode 4146. The pixel defining layer 4112 may include organic material or inorganic material. Examples of the material that may be used for the pixel defining layer 4112 may include photoresist, a poly acrylic resin, a polyimide resin, an acrylic resin, a silicon compound, etc. A display region and a non-display region are defined on the OLED by the exposed portion of the first electrode 4146 that is exposed by the pixel defining layer 4112. For example, the exposed portion of the first electrode 4146, which is exposed by the pixel defining layer 4112 corresponds to the display region. A remaining portion of the pixel defining layer 4112 defines a non-display region.

The organic light emitting element 4200 is disposed on the first electrode 4146 that is exposed by the pixel defining layer 4112. The second electrode 4148 covers the organic light emitting element 4200 and the pixel defining layer 4112.

When the display panel DP has the front illumination type, the second electrode 4148 may include a transparent conductive material. Examples of the transparent conductive material that may be used for the second electrode 4148 may include indium tin oxide, tin oxide, indium zinc oxide, zinc oxide, indium gallium oxide, gallium oxide, etc. These may be used alone or in a combination thereof.

In the present exemplary embodiment, the first laminating member 4300 is disposed inside of a vehicle, and the display panel DP is disposed outside of a vehicle. In addition, the encapsulation substrate 4150 of the display panel DP is disposed adjacent to the first laminating member 4300. Thus, the encapsulation substrate 4150 and the thin film transistor substrate 4100 are sequentially disposed on the first laminating member 4300. The display panel DP may be a transparent display panel.

Figure 18:
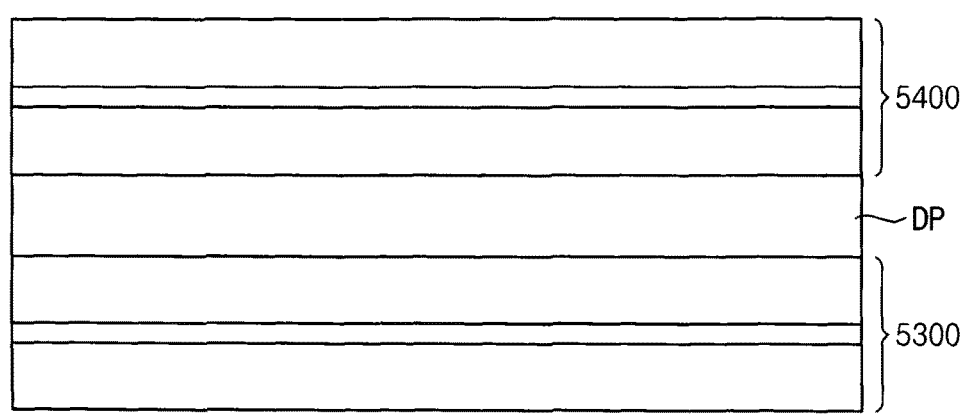
FIG. 18 is a cross-sectional view illustrating a window display device according to an exemplary embodiment of the inventive concept.
Figure 19:
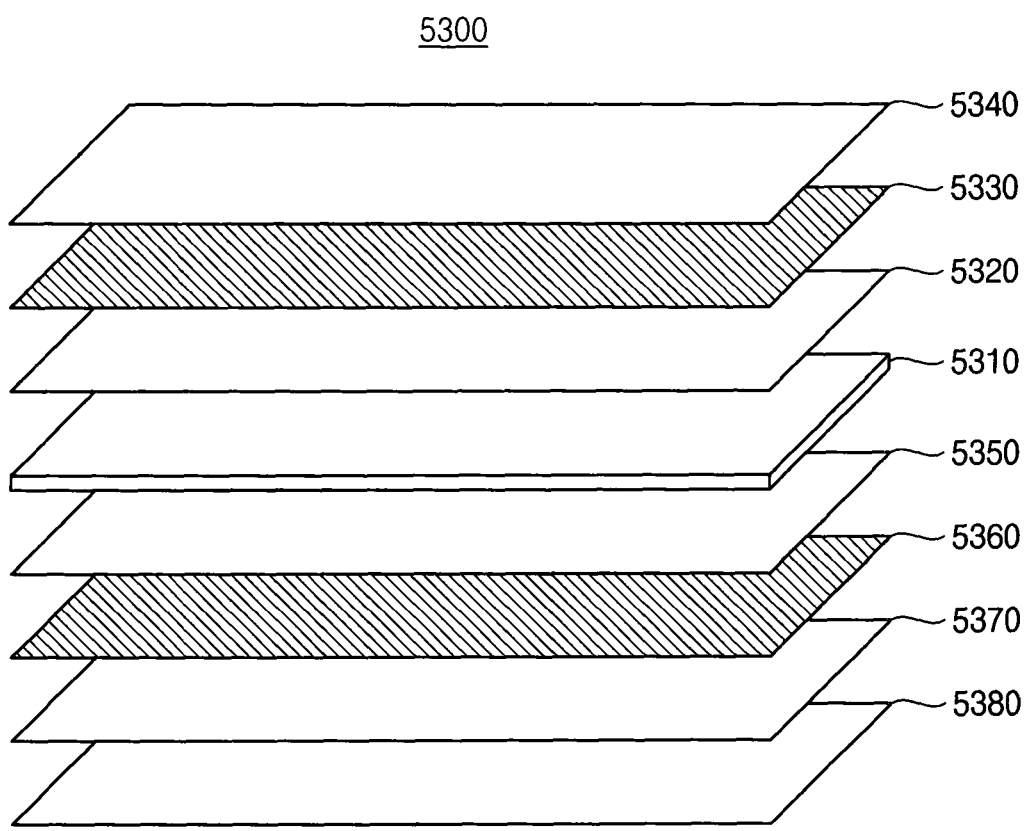
FIG. 19 is a perspective view illustrating a first laminating member of FIG. 18.
Figure 20:
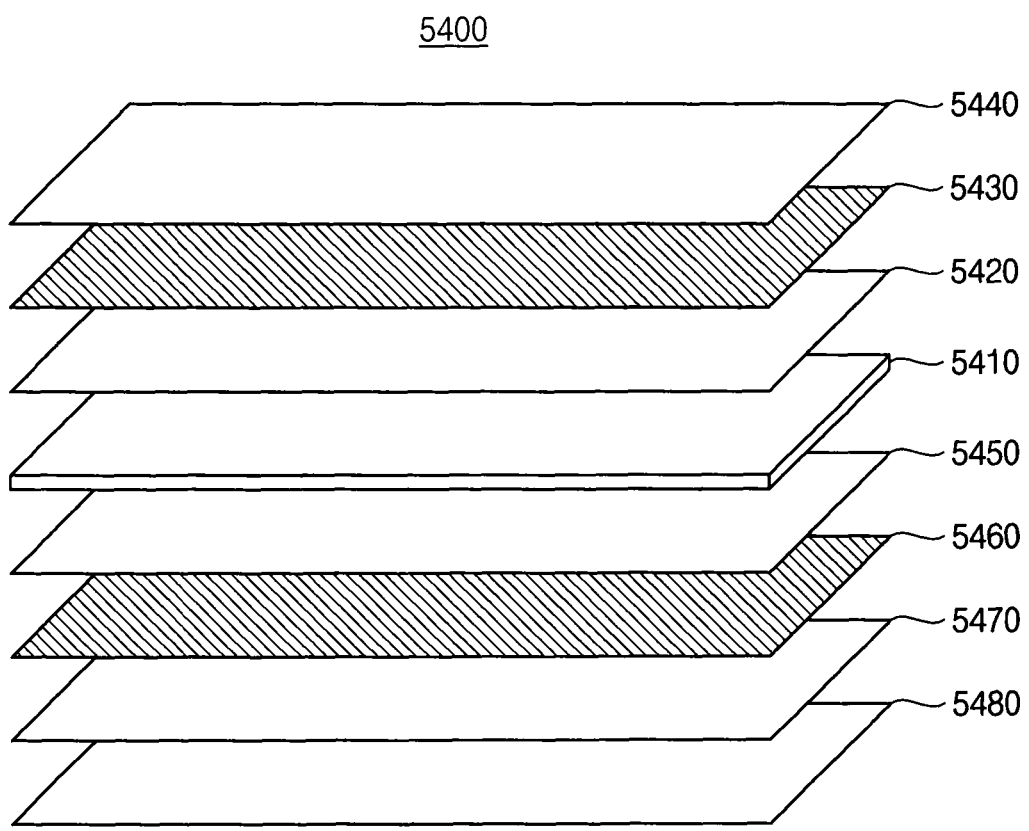
FIG. 20 is a perspective view illustrating a second laminating member of FIG. 18.

FIG. 18 is a cross-sectional view illustrating a window display device according to an exemplary embodiment of the inventive concept. FIG. 19 is a perspective view illustrating a first laminating member of FIG. 18. FIG. 20 is a perspective view illustrating a second laminating member of FIG. 18.

Referring to FIGS. 18 to 20, a window display device according to an exemplary embodiment of the inventive concept includes a display panel DP, a first laminating member 5300 a first glass 5310, a second glass 5410 and a second laminating member 5400.

The first laminating member 5300 may include a first polarizing layer disposed on a first surface of the first glass 5310, a second polarizing layer disposed on a second surface of the first glass 5310 and a protection film 5380. The first polarizing layer may include first supporting films 5320 and 5340 and the first polarizing film 5330 disposed on the first supporting films 5320 and 5340. The second polarizing layer may include second supporting films 5350 and 5370 and second polarizing film 5360 disposed on the second supporting films 5350 and 5370. The first glass 5310 may be a glass for vehicle.

The first supporting films 5320 and 5340 are disposed on the first glass 5310. The first supporting films 5320 and 5340 may support the first polarizing film 5330. The first supporting films 5320 and 5340 may improve the durability, robustness, thermal resistance, and moisture tolerance of the first polarizing film 5330.

The first supporting films 5320 and 5340 may include tri acetate cellulose ("TAC").

Alternatively, the first supporting films 5320 and 5340 may include polyethyleneterephthalate, polyethylene glycol, polymethylmetacrylate, polycarbonate and so on.

The first polarizing film 5330 polarizes the light passing through the first polarizing film 5330. For example, the first polarizing film 5330 includes polyvinyl alcohol ("PVA"). The first polarizing film 5330 may be manufactured by adsorbing iodine or a dichromatic dye on a PVA film and extending the PVA film in a direction.

Alternatively, the first polarizing film 5330 may include polycarbonate, polystyrene, polymethacrylate and so on.

In the present exemplary embodiment, the first polarizing film 5330 may be a ⅛-wavelength (⅛λ) film.

The second supporting films 5350 and 5370 are disposed on the first glass 5310. The second supporting films 5350 and 5370 may support the second polarizing film 5360. The second supporting films 5350 and 5370 may improve the durability, robustness, thermal resistance, and a moisture tolerance of the second polarizing film 5360.

The second supporting films 5350 and 5370 may include tri acetate cellulose ("TAC").

Alternatively, the second supporting films 5350 and 5370 may include polyethyleneterephthalate, polyethylene glycol, polymethylmetacrylate, polycarbonate and so on.

The second polarizing film 5360 polarizes the light passing through the second polarizing film 5360. For example, the second polarizing film 5360 includes polyvinyl alcohol ("PVA"). The second polarizing film 5360 may be manufactured by adsorbing iodine or a dichromatic dye on a PVA film and extending the PVA film in a direction.

Alternatively, the second polarizing film 5360 may include polycarbonate, polystyrene, polymethacrylate and so on.

In the present exemplary embodiment, the second polarizing film 5360 may be a ⅛-wavelength (⅛λ) film.

A phase of the first laminating member 5300 and a phase of the second laminating member 5400 may be substantially the same. The second laminating member 5400 is substantially same as the first laminating member 5300, and thus repetitive explanation will be omitted.

Figure 21:
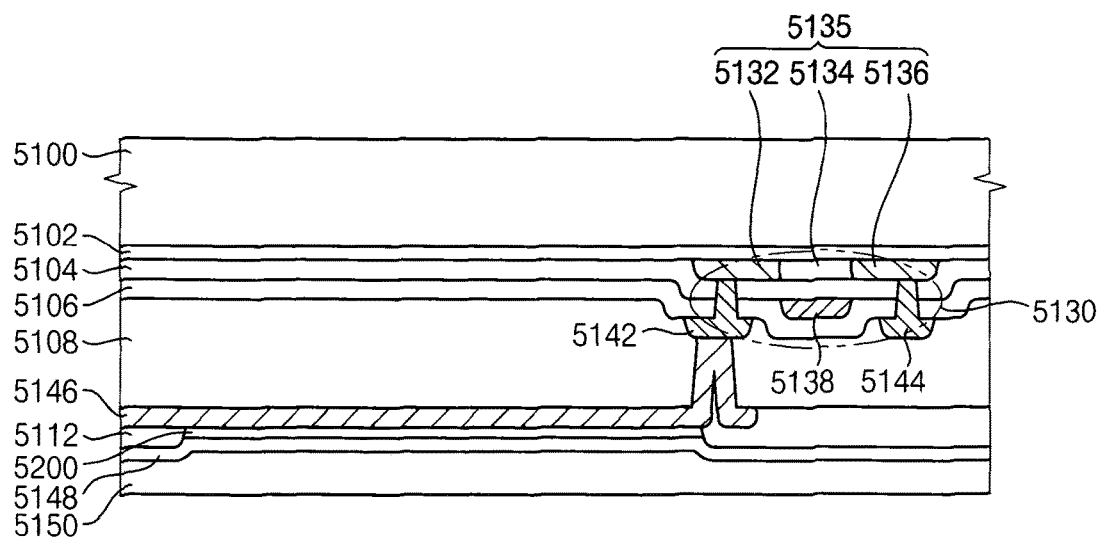
FIG. 21 is a cross-sectional view illustrating a display panel of FIG. 18.

FIG. 21 is a cross-sectional view of the display panel DP shown in FIG. 18.

The display panel DP according to the present exemplary embodiment is substantially same as the display panel DP of FIGS. 15 and 17, and thus same reference numerals are used for same elements and repetitive explanation will be omitted.

In the present exemplary embodiment, the first laminating member 5300 is disposed inside of a vehicle, and the second laminating member 5400 is disposed outside of a vehicle. In addition, the encapsulation substrate 5150 of the display panel DP is disposed adjacent to the first laminating member 5300, and the thin film transistor substrate 5100 is disposed adjacent to the second laminating member 5400. Thus, the encapsulation substrate 5150 and the thin film transistor substrate 5100 are sequentially disposed on the first laminating member 5300. The display panel DP may be a transparent display panel.

Figure 22:
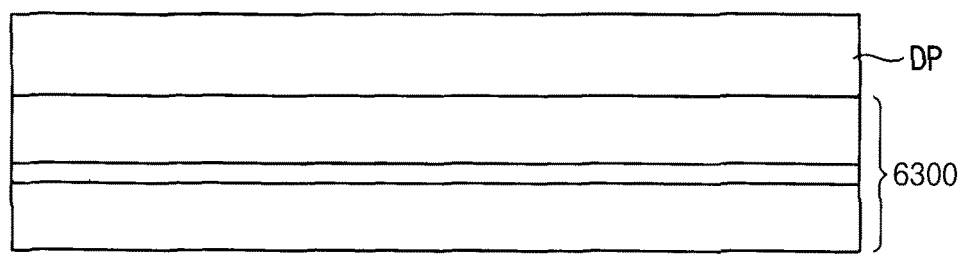
FIG. 22 is a cross-sectional view illustrating a window display device according to an exemplary embodiment of the inventive concept.
Figure 23:
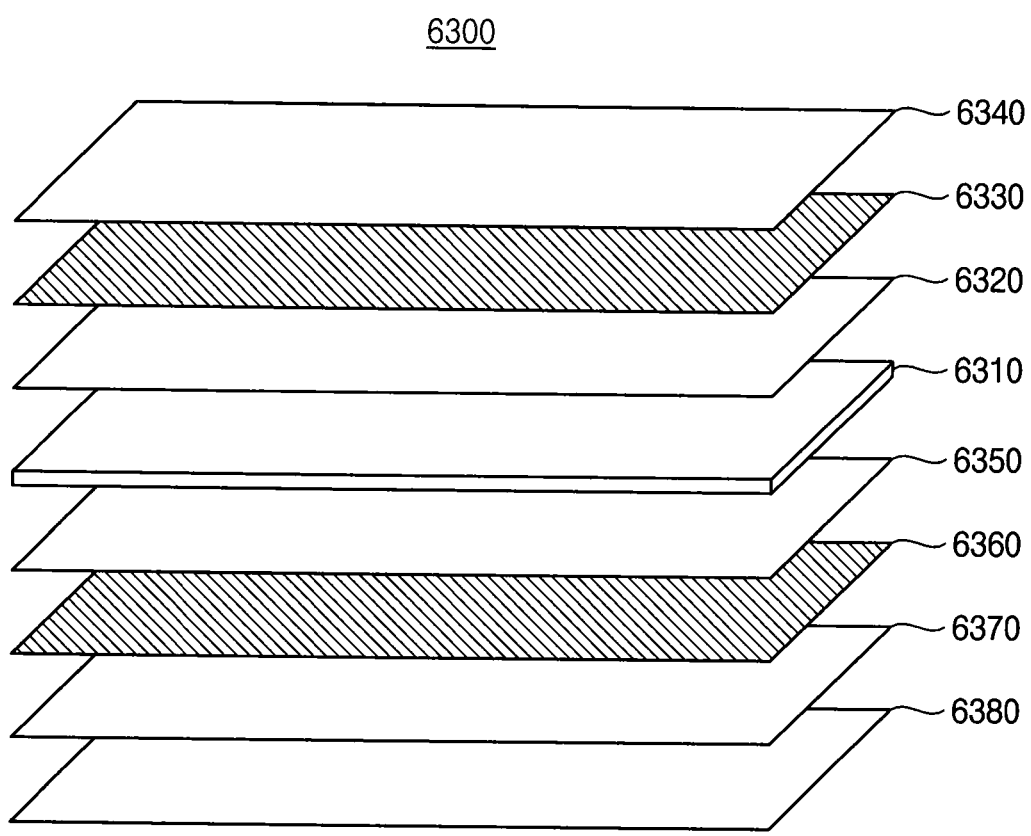
FIG. 23 is a perspective view illustrating a first laminating member of FIG. 22.
Figure 24:
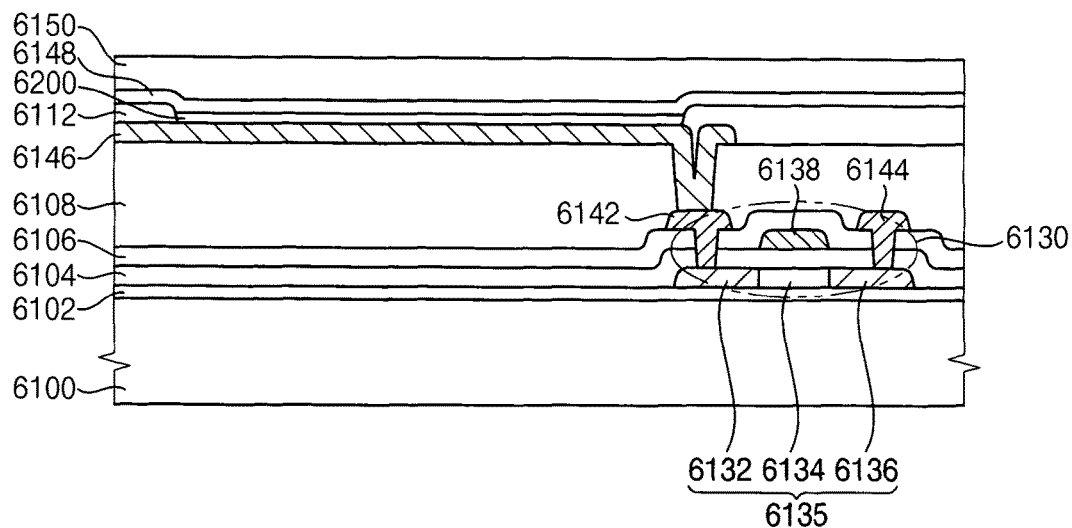
FIG. 24 is a cross-sectional view illustrating a display panel of FIG. 22.

FIG. 22 is a cross-sectional view illustrating a window display device according to an exemplary embodiment of the inventive concept. FIG. 23 is a perspective view illustrating a first laminating member of FIG. 22. FIG. 24 is a cross-sectional view illustrating a display panel of FIG. 22.

The window display device according to the present exemplary embodiment is substantially same as the window display device of FIGS. 15 to 17 except for a direction of the display panel DP, and thus same reference numerals are used for same elements and repetitive explanation will be omitted.

Referring to FIGS. 22 to 24, a window display device according to an exemplary embodiment of the inventive concept includes a display panel DP, a first laminating member 6300 and a first glass 6310.

In the present exemplary embodiment, the first laminating member 6300 is disposed inside of a vehicle, the display panel DP is disposed outside of a vehicle. In addition, the thin film transistor substrate 6100 of the display panel DP is disposed adjacent to the first laminating member 6300. Thus, the thin film transistor substrate 6100 and the encapsulation substrate 6150 are sequentially disposed on the first laminating member 6300. The display panel DP may be a transparent display panel.

The first laminating member 6300 may include a first polarizing layer disposed on a first surface of the first glass 6310, a second polarizing layer disposed on a second surface of the first glass 6310 and a protection film 6380. The first polarizing layer may include first supporting films 6320 and 6340 and the first polarizing film 6330 disposed on the first supporting films 6320 and 6340. The second polarizing layer may include second supporting films 6350 and 6370 and second polarizing film 6360 disposed on the second supporting films 6350 and 6370. The layers of the first laminating member 6300 are substantially similar to the layers of the first laminating member 300 described above.

FIG. 24 is a cross-sectional view illustrating a display panel of FIG. 22. FIG. 24 shows a TFT substrate 6100, a buffer layer 6102, a gate insulating layer 6104, an insulating interlayer 6106, a planarizing layer 6108, a first electrode 6146, a pixel defining layer 6112, an organic light-emitting diode 6200, a second electrode 6148, and an encapsulation substrate 6150. The display panel also includes a thin film transistor 6130 on an active pattern 6135. The thin film transistor 6130 includes a drain electrode 6142, a gate electrode 6138, and a source electrode 6144. The active pattern 6135 includes a drain contact portion 6132, a channel portion 6134, and a source contact portion 6136. Details of these parts are provided above, for example in reference to FIG. 17.

Figure 25:
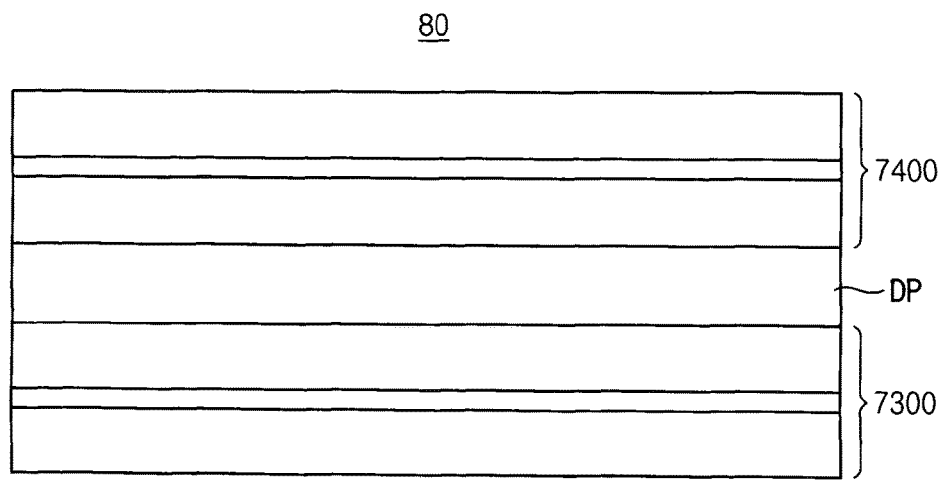
FIG. 25 is a cross-sectional view illustrating a window display device according to an exemplary embodiment of the inventive concept.
Figure 26:
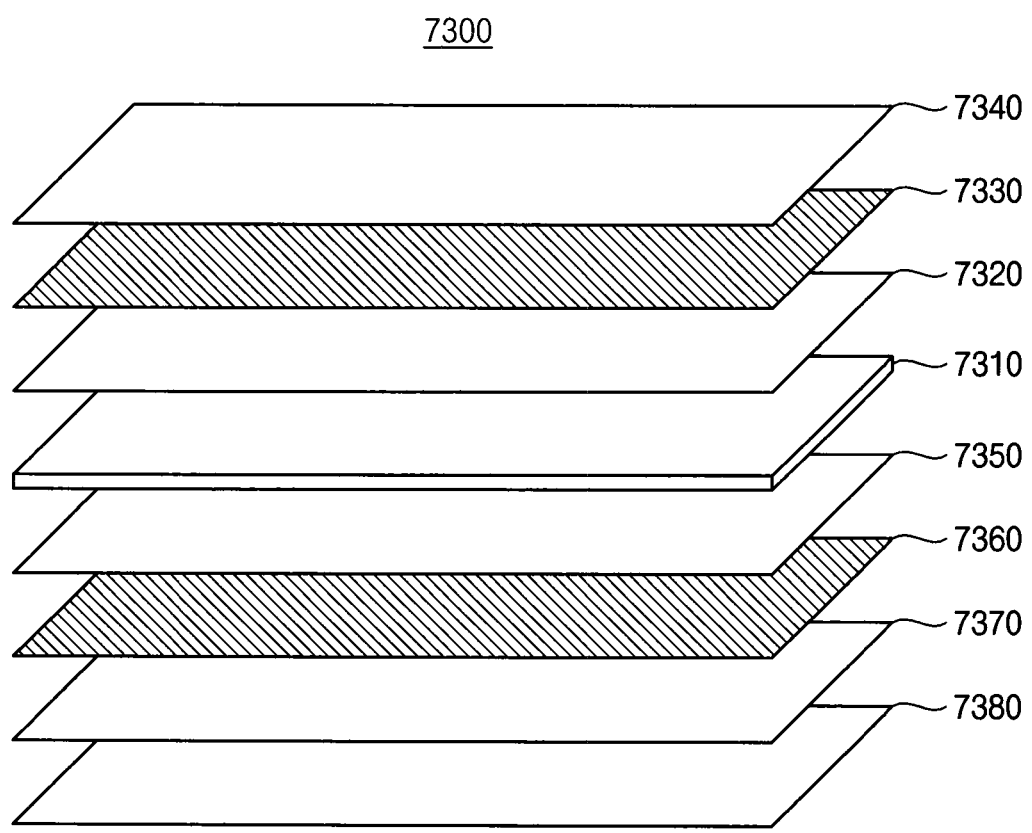
FIG. 26 is a perspective view illustrating a first laminating member of FIG. 25.
Figure 27:
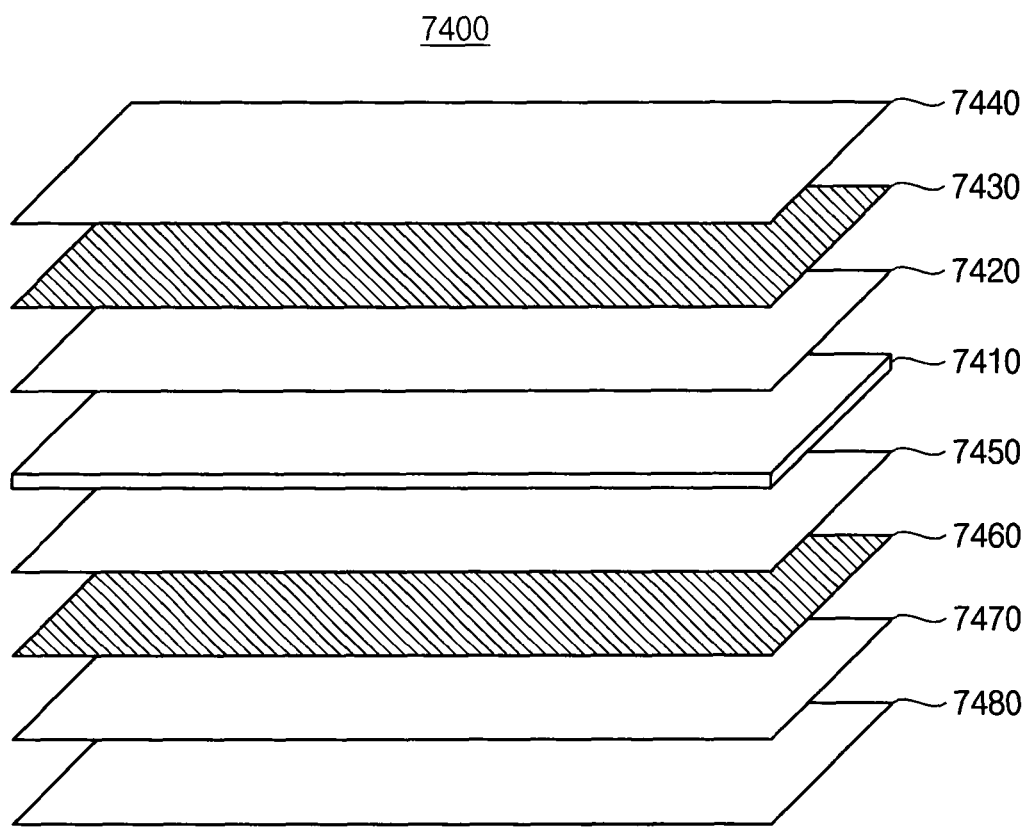
FIG. 27 is a perspective view illustrating a second laminating member of FIG. 25.
Figure 28:
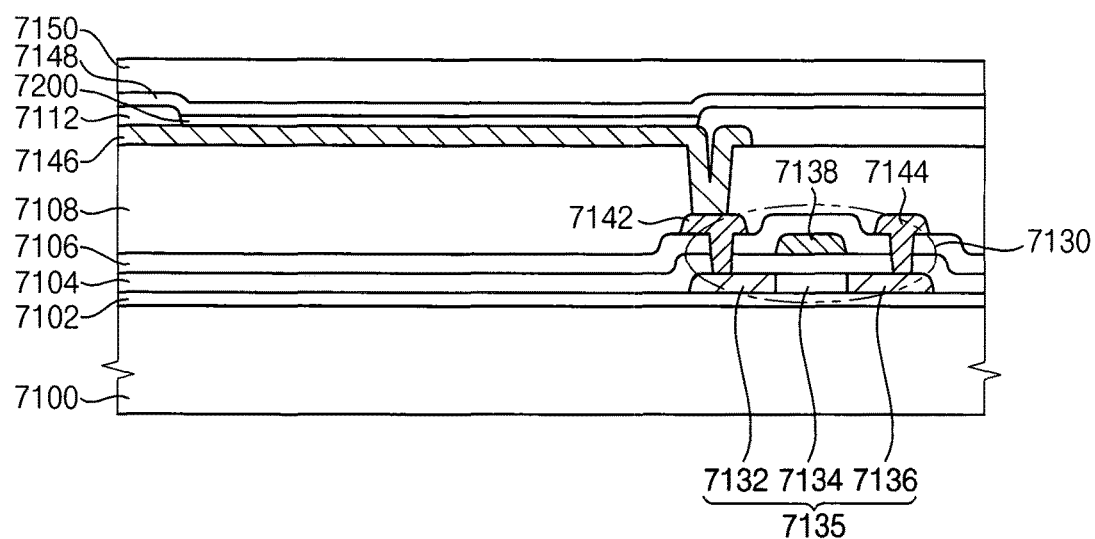
FIG. 28 is a cross-sectional view illustrating a display panel of FIG. 25.

FIG. 25 is a cross-sectional view illustrating a window display device according to an exemplary embodiment of the inventive concept. FIG. 26 is a perspective view illustrating a first laminating member of FIG. 25. FIG. 27 is a perspective view illustrating a second laminating member of FIG. 25. FIG. 28 is a cross-sectional view illustrating a display panel of FIG. 25.

The window display device according to the present exemplary embodiment is substantially same as the window display device of FIGS. 18 to 21 except for a direction of the display panel DP, and thus same reference numerals are used for same elements and repetitive explanation will be omitted.

Referring to FIGS. 25 to 28, a window display device according to an exemplary embodiment of the inventive concept includes a display panel DP, a first laminating member 7300, a first glass 7310, a second glass 7410 and a second laminating member 7400.

In the present exemplary embodiment, the first laminating member 7300 is disposed inside of a vehicle, and the second laminating member 7400 is disposed outside of a vehicle. In addition, the encapsulation substrate 7150 of the display panel DP is disposed adjacent to the first laminating member 7300, and the thin film transistor substrate 7100 is disposed adjacent to the second laminating member 7400. Thus, the encapsulation substrate 7150 and the thin film transistor substrate 7100 are sequentially disposed on the first laminating member 5300. The display panel DP may be a transparent display panel.

FIG. 26 and FIG. 27 show the first laminating member 7300 and the second laminating member 7400, which is structurally similar to the first laminating member 1300 shown in FIG. 5 and the second laminating member 1400 shown in FIG. 6, respectively. In more detail, the first/second laminating member 7300/7400 includes a first polarizing layer disposed on a first surface of the first glass 7310/7410, a second polarizing layer disposed on a second surface of the first glass 7310/7410 and a protection film 7380/7480. The first polarizing layer may include first supporting films 7320/7420 and 7340/7440 and the first polarizing film 7330/7430 disposed on the first supporting films 7320/7420 and 7340/7440. The second polarizing layer may include second supporting films 7350/7450 and 7370/7470 and second polarizing film 7360/7460 disposed on the second supporting films 7350/7450 and 7370/7470.

Figure 29:
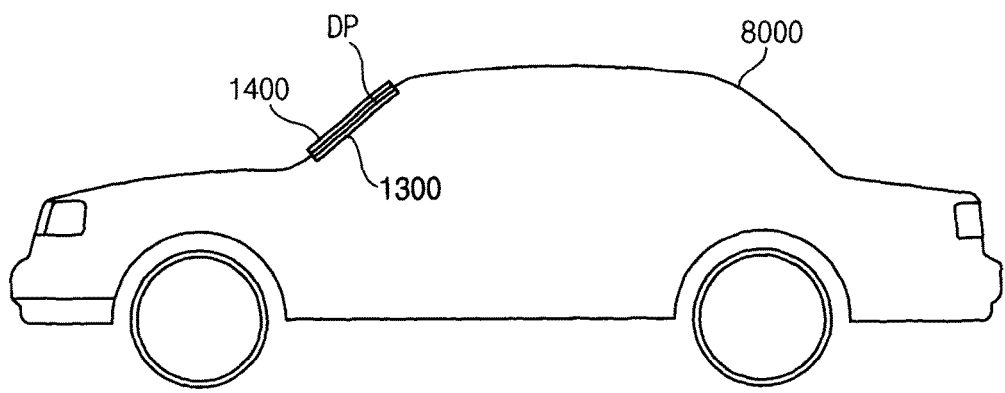
FIG. 29 is a depiction of an example vehicle incorporating the window display device of the inventive concept.

FIG. 29 is a depiction of an example vehicle incorporating the window display device of the inventive concept. In the particular example, the vehicle is an automobile that has a body 8000 and an opening through which the driver can see his/her surroundings. The windshield of the automobile closes the opening and incorporates the window display device such that the first laminating member 1300 is inside of the body 8000 and the second laminating member 1400 is outside of the body 8000. The windshield in this particular example may be replaced by any embodiment of the window display devices described above.

According to the present exemplary embodiment, a window display device includes a plurality of polarizing layers including supporting films and polarizing films. Thus, scattering of window of vehicles may be prevented.

The foregoing is illustrative of the present inventive concept and is not to be construed as limiting thereof. Although a few exemplary embodiments of the present inventive concept have been described, those skilled in the art will readily appreciate that many modifications are possible in the exemplary embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A window display device comprising:
a display panel configured to display an image;
a first glass disposed on a first surface of the display panel;
a first laminating member comprising a first polarizing layer disposed on a first surface of the first glass and a second polarizing layer disposed on a second surface of the first glass,
wherein the first polarizing layer comprises:
a first supporting film; and
a first polarizing film disposed on the first supporting film, and
wherein the second polarizing layer comprises:
a second supporting film; and
a second polarizing film disposed on the second supporting film
wherein the window display device further comprises:
a second glass disposed on the second surface of the display panel; and
a second laminating member comprising a third polarizing layer disposed on a first surface of the second glass and a fourth polarizing layer disposed on a second surface of the second glass,
wherein the third polarizing layer comprises:
a third supporting film; and
a third polarizing film disposed on the third supporting film, and
wherein the fourth polarizing layer comprises:
a fourth supporting film; and
a fourth polarizing film disposed on the fourth supporting film.

2. The window display device of claim 1, wherein the third polarizing film and the fourth polarizing film are quarter-wavelength (¼λ) films.

3. A window display device comprising:
a display panel configured to display an image;
a first laminating member disposed on a first surface of the display panel and comprising a first polarizing layer and a second polarizing layer; and
a first glass disposed between the first polarizing layer and the second polarizing layer of the first laminating member,
wherein the first polarizing layer comprises:
a first supporting film; and
a first polarizing film disposed on the first supporting film, and
wherein the second polarizing layer comprises:
a second supporting film; and
a second polarizing film disposed on the second supporting film, wherein the window display device further comprises:
a thin film transistor substrate on which a thin film transistor is disposed;
a first electrode electrically connected to the thin film transistor;
an organic light emitting element disposed on the first electrode;
a second electrode covering the organic light emitting element; and
an encapsulation substrate facing the thin film transistor substrate and disposed on the second electrode,
wherein the encapsulation substrate and the thin film transistor substrate are sequentially disposed on the first laminating member,
wherein the first polarizing film and the second polarizing film are ⅛-wavelength (⅛λ) films
wherein the window display device further comprises:
a second glass disposed on the second surface of the display panel; and
a second laminating member comprising a third polarizing layer disposed on a first surface of the second glass and a fourth polarizing layer disposed on a second surface of the second glass,
wherein the third polarizing layer comprises:
a third supporting film; and
a third polarizing film disposed on the third supporting film, and
wherein the fourth polarizing layer comprises:
a fourth supporting film; and
a fourth polarizing film disposed on the fourth supporting film.

4. The window display device of claim 3, wherein the third polarizing film and the fourth polarizing film are ⅛-wavelength (⅛λ) films.

5. A window display device comprising:
a display panel configured to display an image;
a first laminating member disposed on a first surface of the display panel and comprising a first polarizing layer and a second polarizing layer; and
a first glass disposed between the first polarizing layer and the second polarizing layer of the first laminating member,
wherein the first polarizing layer comprises:
a first supporting film; and
a first polarizing film disposed on the first supporting film, and
wherein the second polarizing layer comprises:
a second supporting film; and
a second polarizing film disposed on the second supporting film,
wherein the window display device further comprises:
a thin film transistor substrate on which a thin film transistor is disposed;
a first electrode electrically connected to the thin film transistor;
an organic light emitting element disposed on the first electrode;
a second electrode covering the organic light emitting element; and
an encapsulation substrate facing the thin film transistor substrate and disposed on the second electrode,
wherein the thin film transistor substrate and the encapsulation substrate are sequentially disposed on the first laminating member
wherein the first polarizing film and the second polarizing film are ⅛-wavelength (⅛λ) films,
wherein the window display device further comprises:
a second glass disposed on the second surface of the display panel; and
a second laminating member comprising a third polarizing layer disposed on a first surface of the second glass and a fourth polarizing layer disposed on a second surface of the second glass,
wherein the third polarizing layer comprises:
a third supporting film; and
a third polarizing film disposed on the third supporting film, and
wherein the fourth polarizing layer comprises:
a fourth supporting film; and
a fourth polarizing film disposed on the fourth supporting film.

6. The window display device of claim 5, wherein the third polarizing film and the fourth polarizing film are ⅛-wavelength (⅛λ) films.

* * * * *